(12) United States Patent
Yabe et al.

(10) Patent No.: US 8,724,668 B2
(45) Date of Patent: May 13, 2014

(54) LIGHT SOURCE DEVICE

(75) Inventors: Mitoru Yabe, Tokyo (JP); Yukio Sato, Tokyo (JP); Toru Yoshihara, Tokyo (JP); Tetsuo Funakura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 443 days.

(21) Appl. No.: 12/850,668

(22) Filed: Aug. 5, 2010

(65) Prior Publication Data

US 2011/0096543 A1 Apr. 28, 2011

(30) Foreign Application Priority Data

Oct. 28, 2009 (JP) ................................. 2009-248214

(51) Int. Cl.
*H01S 3/04* (2006.01)

(52) U.S. Cl.
USPC ............ 372/36; 372/34; 372/50.12; 362/235; 362/249.01; 362/249.11

(58) Field of Classification Search
CPC . H01S 5/005; H01S 5/02415; H01S 5/02212; H01S 5/4025; G02B 6/4201; G02B 6/4204; F21V 5/04; F21V 4/00
USPC .............. 372/34, 36, 50.12; 362/235, 249.01, 362/249.11
See application file for complete search history.

(56) References Cited

U.S. PATENT DOCUMENTS

| | | | |
|---|---|---|---|
| 5,872,803 A * | 2/1999 | Mori et al. ...................... | 372/75 |
| 6,343,092 B1 | 1/2002 | Naoe et al. | |
| 2005/0057527 A1 | 3/2005 | Takenaka et al. | |
| 2006/0034571 A1 | 2/2006 | Nagano et al. | |
| 2007/0019694 A1 | 1/2007 | Miura | |
| 2007/0237455 A1 | 10/2007 | Sonoda et al. | |
| 2010/0135018 A1* | 6/2010 | Plank ........................... | 362/244 |

FOREIGN PATENT DOCUMENTS

| | | | | |
|---|---|---|---|---|
| JP | 2000286483 A | * 10/2000 | ............. | H01S 3/042 |
| JP | 2000-318628 A | 11/2000 | | |
| JP | 2005-92537 A | 4/2005 | | |
| JP | 2006-284851 A | 10/2006 | | |
| JP | 2007-19301 A | 1/2007 | | |
| JP | 2007-25431 A | 2/2007 | | |
| JP | 2007-67271 A | 3/2007 | | |
| JP | 2007-116481 A | 5/2007 | | |
| JP | 4115732 B | 4/2008 | | |
| JP | 2009-140718 A | 6/2009 | | |
| JP | 2009-246040 A | 10/2009 | | |

OTHER PUBLICATIONS

Canadian Office action, Feb. 22, 2013.

* cited by examiner

*Primary Examiner* — Yuanda Zhang
(74) *Attorney, Agent, or Firm* — Birch, Stewart, Kolasch & Birch, LLP

(57) ABSTRACT

Included are, a module fixing body having a plurality of mounting holes into which laser modules are fitted and accommodated, respectively; an electricity-supplying member having an end provided with electricity-supplying terminals, which are connected to electricity-receiving terminals of the laser module accommodated in the mounting hole; and a cooling member that cools each of the laser modules. A groove in which the electricity-supplying member is accommodated is formed in a surface of the module fixing body, and the cooling member is closely arranged on the surface of the module fixing body.

23 Claims, 21 Drawing Sheets

LIGHT SOURCE DEVICE

BACKGROUND OF THE INVENTION

1. Field of the Invention

The present invention relates to a light source device used for a picture display device or the like, and more particularly to a light source device that synthesizes laser beams emitted from a plurality of semiconductor laser devices and concentrates the beams into an optical fiber in order to obtain a predetermined light output.

2. Description of the Related Art

A conventional light source device, which synthesizes laser beams emitted from a plurality of semiconductor laser devices and concentrates the beams into an optical fiber, in order to obtain a predetermined light output, is configured to include: a plurality of chip-like semiconductor lasers arranged and fixed on a heat block; collimator lens arrays provided corresponding to the semiconductor lasers; a condenser lens that concentrates collimator light flux generated by the collimator lens arrays into one optical fiber; and a box-like package that air-tightly seals these multiplexing optical systems.

According to the light source device of this kind, to concentrate laser beams emitted from the semiconductor laser devices into an optical fiber, the semiconductor laser devices, the collimator lens arrays, the condenser lens, and the optical fiber must be fixed with a predetermined positional precision in a state that inclinations of these parts precisely match with each other. To fix these parts in this manner, there is proposed a structure in which inclinations of precisely formed parts are measured by a laser automatic collimator and in this state, these parts are positioned precisely by a mechanical hand and are adhered and fixed (see, for example, Japanese Patent Application Laid-open No. 2006-284851 (Page 7 and FIG. 1)).

When a semiconductor laser device having an emission wavelength in a range of 350 to 450 nanometers is used, organic gas (out gas) components of e.g., an adhesive for fixing multiplexing optical systems are deposited on a light emitting unit and an optical member, and this deteriorates laser characteristics. To solve this problem, there is proposed a light source device in which the concentration of organic gas in a package is limited to less than 1000 parts per million (ppm), and inert gas having an oxygen concentration in a range of 1 to 100 ppm is enclosed into the package (see, for example, Japanese Patent No. 4115732 (Page 5 and FIG. 2)).

However, the conventional light source device has a problem in that, due to the above configuration, a structure for taking wires for driving the semiconductor laser out of the hermetic package becomes complicated.

The semiconductor laser device generates a large quantity of heat by emitting light, and accordingly has characteristics such that its light emitting efficiency is deteriorated by the heat and thus its lifetime is reduced, and its wavelength is shifted. Therefore, it is important to control heat radiation and the temperature thereof. However, the semiconductor laser device has a problem in that it cannot efficiently release the heat to outside from a fixed heat block to which the semiconductor laser device is fixed. Because the condenser lens and the semiconductor laser device are arranged on the same base plate, the thermal capacity of a portion whose temperature is to be controlled is large, and the cooling operation cannot be efficiently performed.

SUMMARY OF THE INVENTION

It is an object of the present invention to at least partially solve the problems in the conventional technology.

A light source device according to an aspect of the present invention having a plurality of laser modules, in each of which a semiconductor laser is arranged on one side of a stem and electricity-receiving terminals, which receive electricity for driving the semiconductor laser, are arranged on the other side of the stem, and configured to concentrate laser beams emitted from the laser modules and emit the concentrated laser beams, includes: a module fixing body having a plurality of mounting holes into which the laser modules are fitted and accommodated, respectively; an electricity-supplying member having an end provided with electricity-supplying terminals, which are connected to the electricity-receiving terminals of the laser module accommodated in the mounting hole; and a cooling member that cools each of the laser modules, wherein a groove in which the electricity-supplying member is accommodated is formed in a surface of the module fixing body, and the cooling member is closely arranged on the surface of the module fixing body.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of a light source device according to the present invention will be explained below in detail with reference to the accompanying drawings. The present invention is not limited to the embodiments.

First Embodiment

Figure 1:
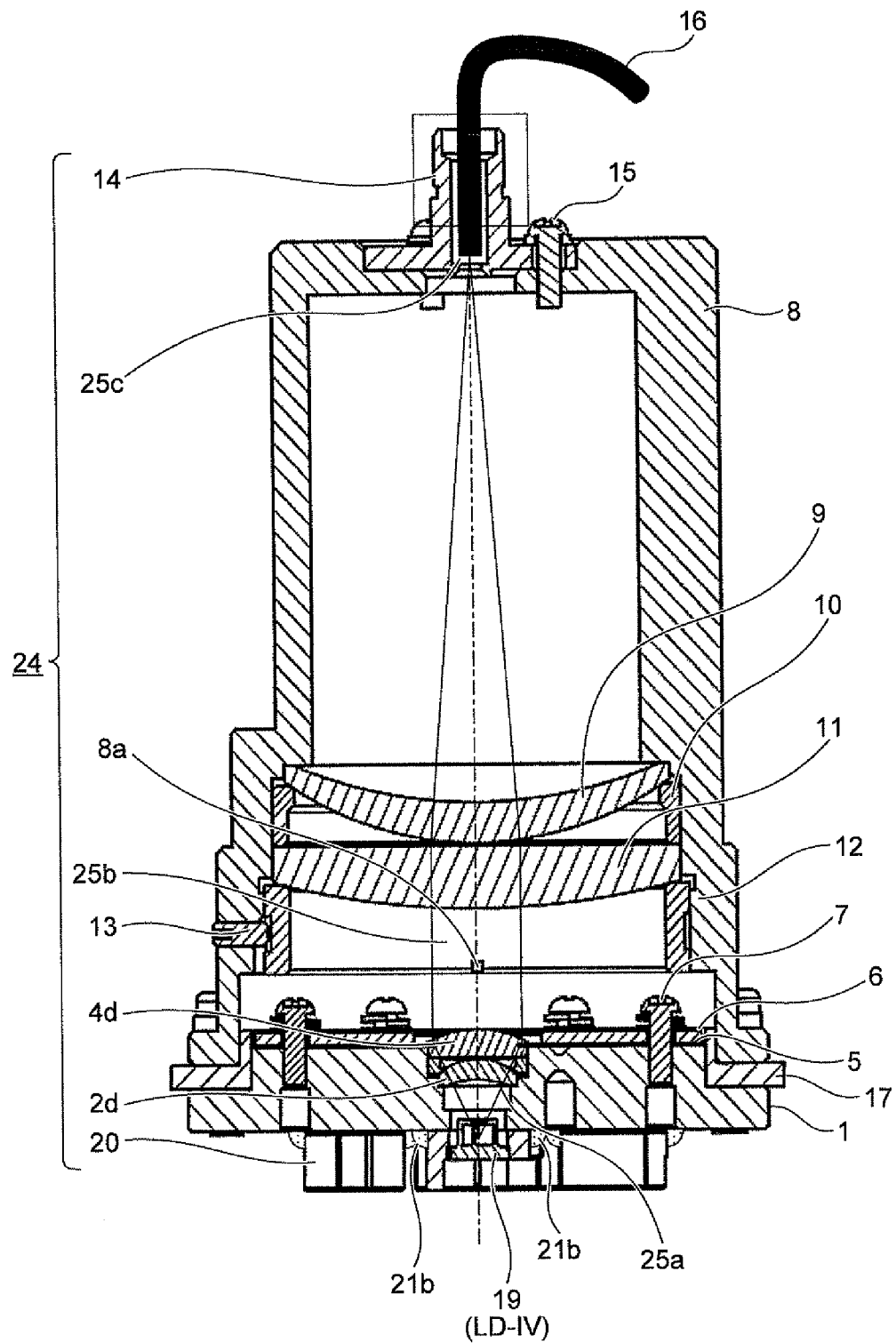
FIG. 1 depicts a sectional view of a configuration of a light source device according to a first embodiment of the present invention.
Figure 2:
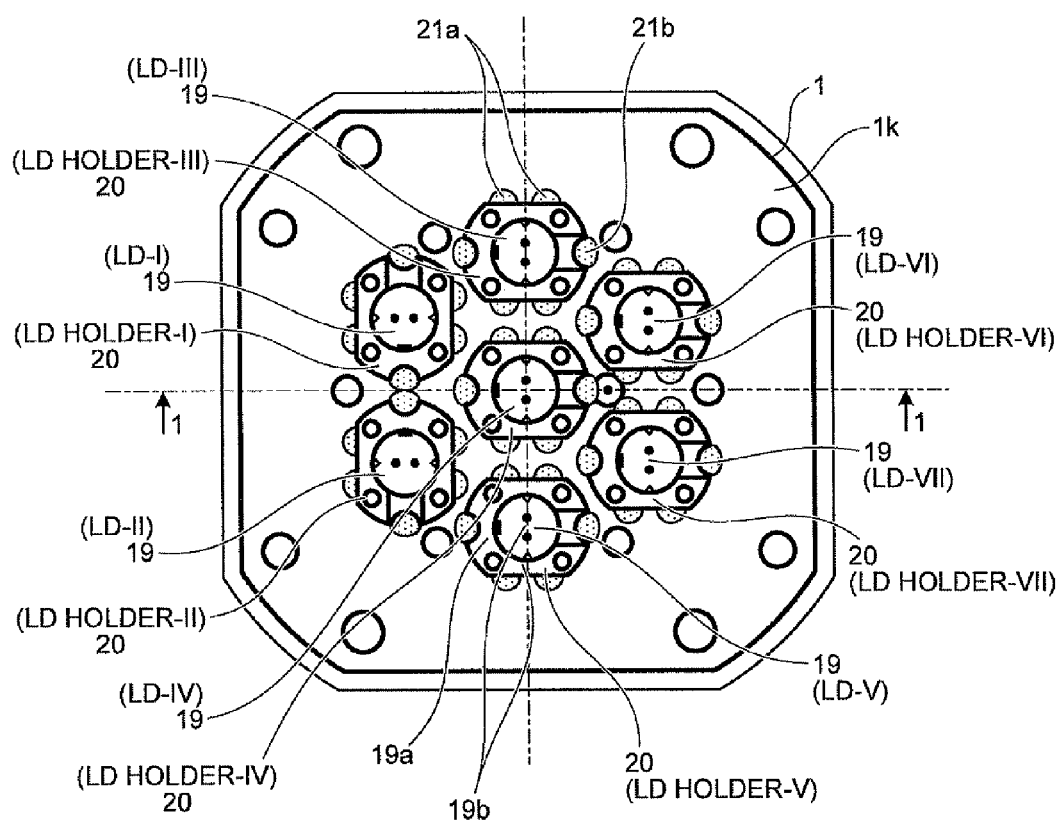
FIG. 2 depicts a bottom view of a configuration of the light source device according to the first embodiment.
Figure 3:
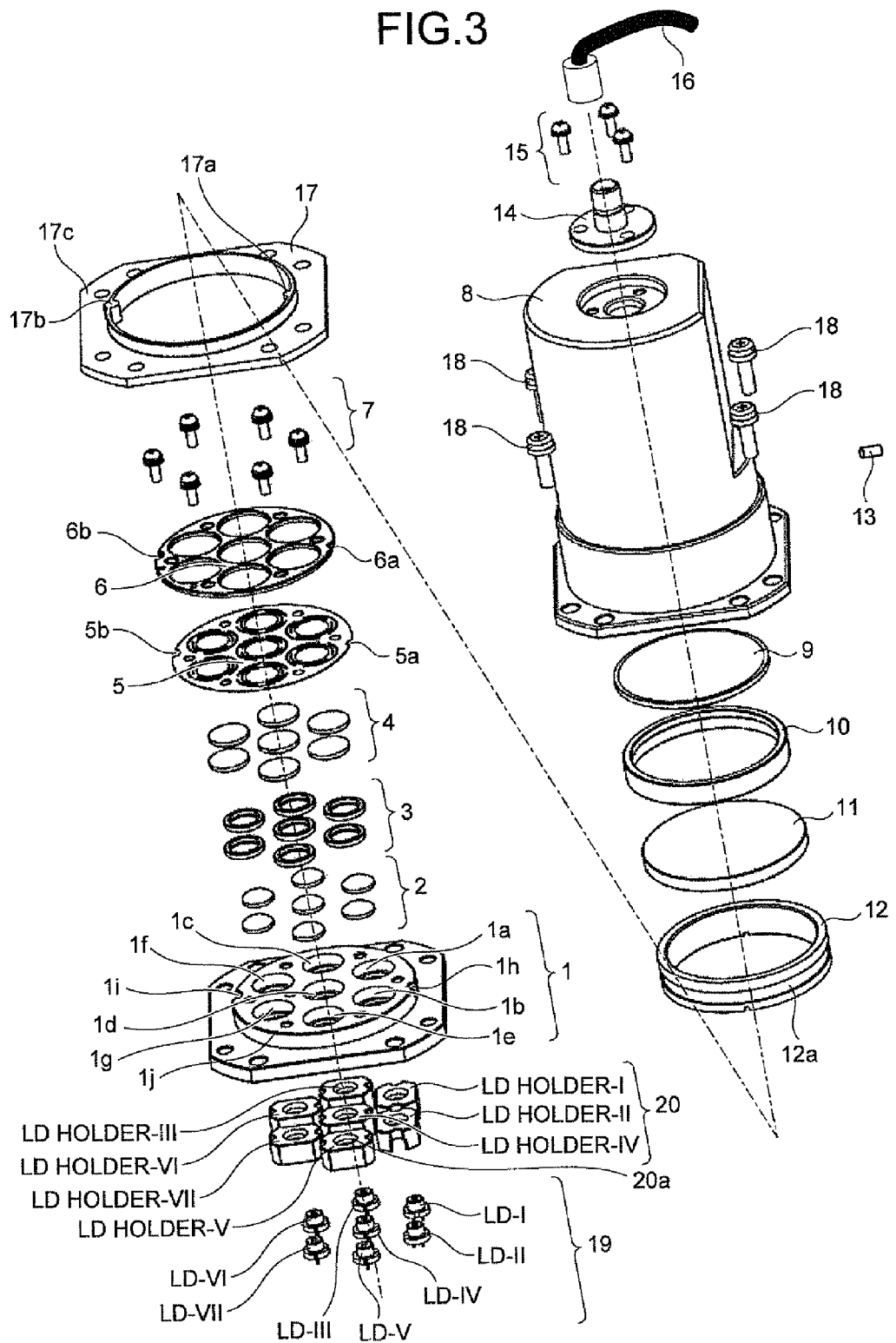
FIG. 3 depicts an exploded view of a configuration of the light source device according to the first embodiment.

FIGS. 1 to 3 depict a configuration of a light source device according to a first embodiment of the present invention, where FIG. 1 is a sectional view, FIG. 2 is a bottom view, and FIG. 3 is an exploded view. FIG. 1 is the sectional view taken along a line 1-1 in FIG. 2.

A base 1 is formed from aluminum die-cast, seven stepped holes 1a to 1g in total are formed in the base 1 at a center and on a circumference around this center at equal distances from one another on the circumference. Semi-circular notches 1h and 1i having different sizes are precisely formed in outer peripheral portions of the base 1. Centers of the notches 1h and 1i are asymmetric about a center of the stepped hole 1d formed at the central portion. A first collimator lens 2, a first spacer 3, and a second collimator lens 4 are fitted to each of the seven stepped holes 1a to 1g, and the second collimator lens 4 slightly projects from an upper surface 1j of the base 1. A leaf spring 5 is formed into a flat-plate shape by etching a spring stainless steel (SUS301) such that gimbal spring-like spring portions are provided at positions corresponding to the seven stepped holes 1a to 1g of the base 1. Notches 5a and 5b are provided at positions corresponding to the notches 1h and 1i of the base 1. A restraining plate 6 is formed into a flat-plate shape by stamping a stainless material (SUS304) thicker than the leaf spring 5 such that holes corresponding to the seven stepped holes 1a to 1g of the base 1 and notches 6a and 6b corresponding to the notches 1h and 1i of the base 1 are formed. The restraining plate 6 presses the leaf spring 5 so that a portion thereof except the spring portion is not deformed. The leaf spring 5 and the restraining plate 6 are fixed without deviation by a plurality of screws 7 such that the notches 5a, 5b, 6a, and 6b match with the notches 1h and 1i of the base 1, and the leaf spring 5 and the restraining plate 6 are pressed against the upper surface 1j of the base 1. Because the notches 1h and 1i are arranged asymmetric around the center of the stepped hole 1d that is arranged at the central portion, front and back surfaces of the leaf spring 5 and the restraining plate 6 are determined uniquely. Also, the leaf spring 5 and the restraining plate 6 do not float or deviate from each other due to a burr or a flatness of the part. With the above configuration, a collimator lens group, which includes the first collimator lens 2, the first spacer 3, and the second collimator lens 4, is precisely fixed to the base 1 such that a deviation is not generated even if a vibration or an impact is applied. Because an adhesive is not used, even if it becomes necessary to disassemble the device for removing a foreign matter, the device can be disassembled such that all of the parts can be reused, and the optics such as the first collimator lens 2 and the second collimator lens 4 are not contaminated by out gas of an adhesive.

A lens barrel 8 is made by cutting aluminum. A first condenser lens 9, a second spacer 10, and a second condenser lens 11 are fitted into the lens barrel 8, and they are fixed by a screw ring 12. The second spacer 10 and the screw ring 12 are made of brass. A recess 12a is provided in a central portion of a side surface of the screw ring 12. A setscrew 13 is screwed from a side surface of the lens barrel 8, and a tip end of the setscrew 13 is inserted into the recess 12a. With this arrangement, the recess 12a is fixed to the lens barrel 8 such that it is not loosened. A receptacle 14 made of brass is fixed to an upper surface of the lens barrel 8 by screws 15 such that an optical fiber 16 can be attached and detached. With this configuration, a condenser lens group formed of the first condenser lens 9, the second spacer 10, and the second condenser lens 11 is precisely fixed to the base 1 such that the group is not deviated even if a vibration or an impact is applied to the group. Because an adhesive is not used, even if it becomes necessary to disassemble the device for removing a foreign matter, the device can be disassembled such that all of parts can be reused without damaging the screw portion of the screw ring 12. Also, the optics such as the first condenser lens 9, the second condenser lens 11 and the optical fiber 16 are not contaminated by out gas of an adhesive.

A spacer 17 is a molded article made of polycarbonate having glass fibers, and the base 1 is fitted into a cylindrical portion of the spacer 17. Projections 17a and 17b corresponding to the notches 1h and 1i of the base 1 are formed inside of the cylindrical portion. A projection 17c corresponding to the notch 8a provided in the lens barrel 8 is provided on outside of the cylindrical portion. In a state that the base 1 and the lens barrel 8 are positioned precisely, they are fastened to the spacer 17 by four conductive screws 18 so that they are restrained from rotating, and a light source module 24 is formed. Because thermal conductivity of the spacer 17 is sufficiently lower than those of the base 1 and the lens barrel 8, heat is not easily transmitted between the base 1 and the lens barrel 8. In addition, because the base 1 and the lens barrel 8 are fastened to each other by the conductive screws 18, they are electrically conductive.

Semiconductor lasers (hereinafter, Laser Diodes (LDs)) 19 are light sources that emit blue light having wavelength of 445 nanometers. Relative orientations in rotating directions of optical axes (polarizing directions) of the seven LDs 19 with respect to an LD holder 20 are all the same, and the LDs 19 are press-fitted to the LD holder 20. There are seven LDs 19 and LD holders 20 corresponding to the collimator lens group. In the following explanations, when it is necessary to distinguish a certain one among the LDs 19 from each other, they are described as LD-I to LD-VII. When it is necessary to distinguish a certain one among the LD holders 20 from each other, they are described as LD holders I to VII. An upper surface 20a of the LD holder 20 to which the LD 19 is press-fitted is arranged such that the upper surface 20a abuts against a bottom surface 1k of the base 1. Optical axes of the LDs 19 and the optical axes of the collimator lens groups are adjusted to appropriate positions on the abutment surfaces, and the LD holder 20 is adhered and fixed to the base 1 by acrylic-based ultraviolet cure adhesives 21a and 21b.

By fixing the lens barrel 8 made of metal to the base 1 by the conductive screws 18 through the plastic spacer 17, the ground of the LD 19 is electrically connected to the lens barrel 8 through the LD holder 20, the base 1, and the screws 18. Therefore, it is possible to suppress generation of unnecessary radiation when the LD 19 is pulse-driven at high frequencies. The lens barrel 8 can be fixed to a later-described Peltier module 34 through the plastic spacer 17 by using a conductive screw.

Figure 4A:
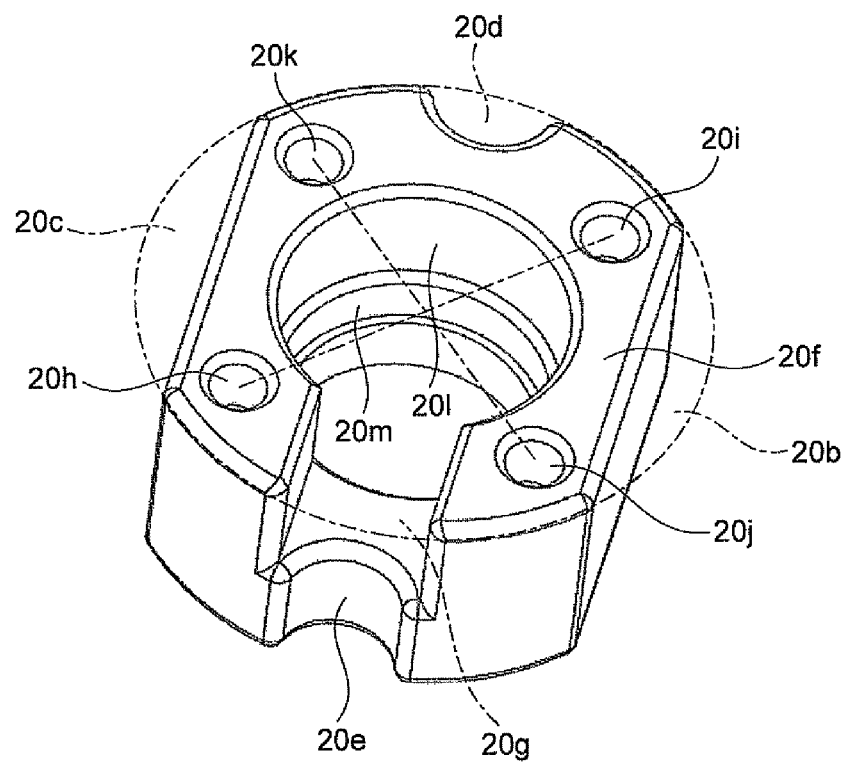
FIGS. 4A and 4B depict perspective views of a detailed configuration of an LD holder according to the first embodiment.
Figure 4B:
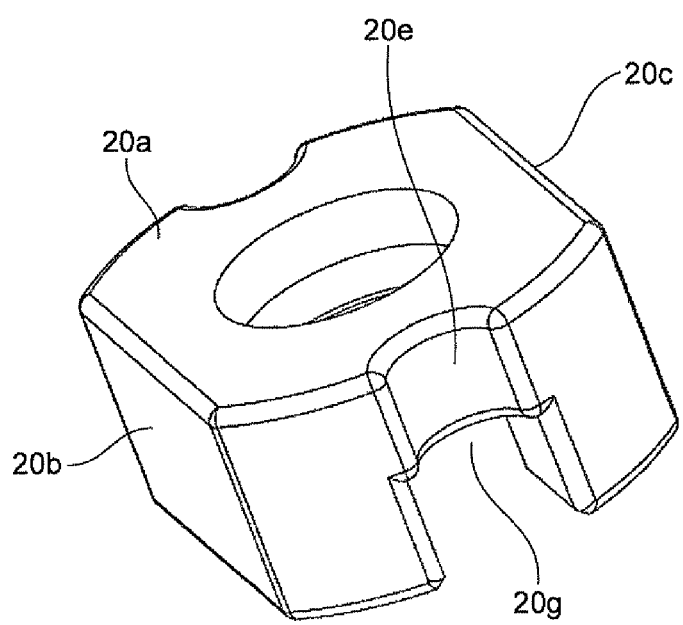

FIGS. 4A and 4B are perspective views of a detailed configuration of the LD holder 20. The LD holder 20 is of a substantially cylindrical shape, and an outer peripheral surface of the LD holder 20 includes two pairs of notched portions 20b and 20c, as well as 20d and 20e that are symmetric about a center axis of an inner surface hole 20l. A stepped portion 20g and two pairs of hole portions 20h and 20i as well as 20j and 20k, which are symmetric about the optical axis of the LD 19, are provided in a lower surface 20f of the LD holder 20. The lower surface 20f is opposite from the upper surface 20a that abuts against the base 1. The hole portions 20h to 20k are provided such that a line connecting centers of the hole portions 20h and 20i and a line connecting centers of the hole portions 20j and 20k intersects with each other at a right angle. The inner surface hole 20l that is a cylindrical inner surface of the LD holder 20 is slightly larger in diameter than a press-fit hole 20m into which the LD 19 is inserted.

Figure 5:
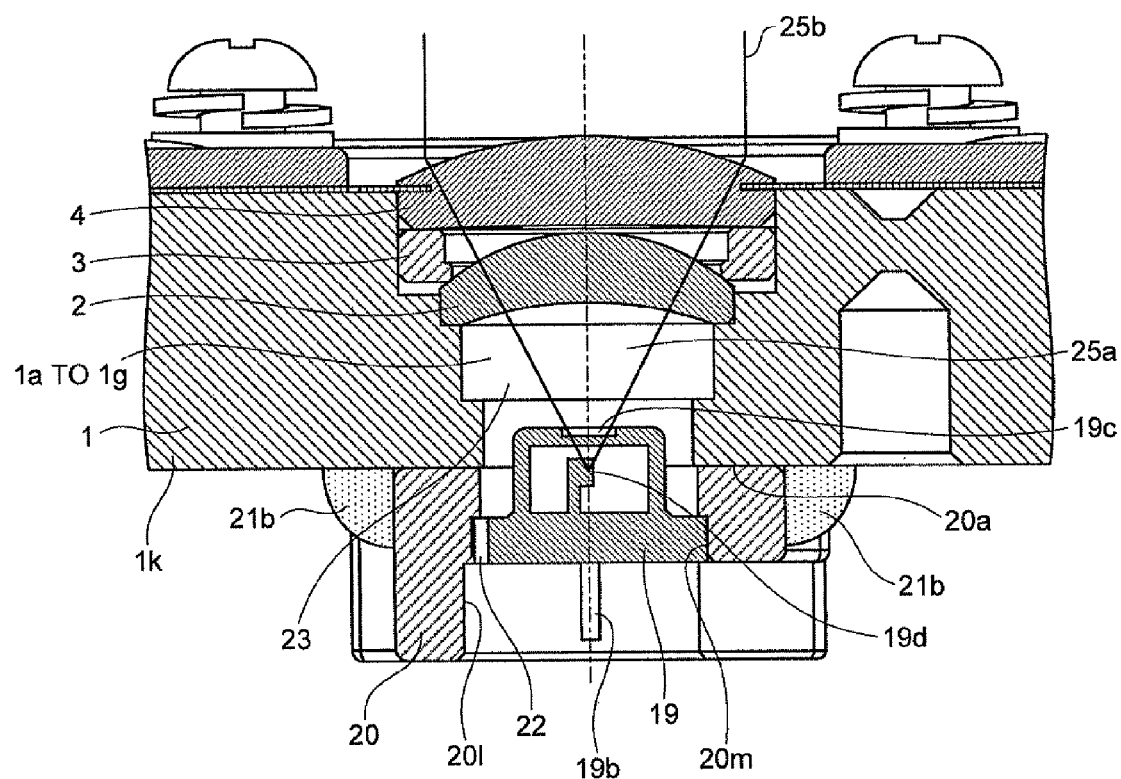
FIG. 5 depicts an enlarged view of a state after the LD holder into which an LD according to the first embodiment is press-fitted is adhered and fixed to a base.
Figure 6:
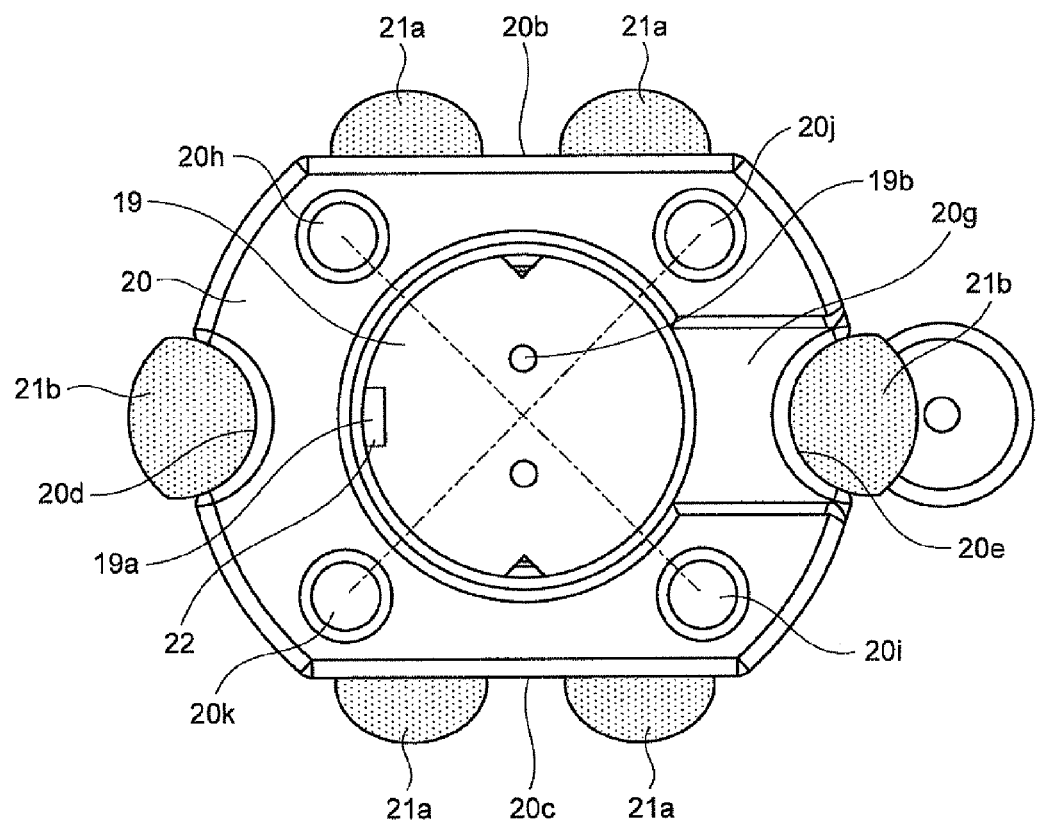
FIG. 6 depicts another enlarged view of a state after the LD holder into which the LD according to the first embodiment is press-fitted is adhered and fixed to a base.

FIGS. 5 and 6 are enlarged views of a state after the LD holder 20 into which the LD 19 is press-fitted is adhered and fixed to the base 1. The LD 19 is a standard CAN package of φ5.6 millimeters, and includes a notch 19a on a stem and conduction leads 19b. A laser beam is emitted from a laser-beam emitting window 19c. A light emitting point 19d of the LD 19 is flush with the upper surface 20a of the LD holder 20 so that even if the LD holder 20 is inclined when adjusting its optical axis in position, an amount of positional deviation of the optical axis of the light emitting point 19d in the vertical direction can be suppressed to the minimum. With this configuration, its centering operability and reliability of a product are enhanced. The LD holder 20 is designed such that when the LD 19 is press-fitted, a through hole 22 is formed between the LD 19 and the inner surface hole 20l of the LD holder 20 by the notch 19a of the LD 19. That is, in a state that the LDs 19 are press-fitted into the LD holders 20 and are adhered and fixed to the base 1, small chambers 23, which are formed by the stepped holes 1a to 1g of the base 1, the first collimator lenses 2, the LD holders 20, and the LDs 19, are in communication with outside air through the through hole 22. The adhesive 21a that fixes the LD holder 20 is applied to four points that are substantially symmetric about the optical axis of the LD 19. The adhesive 21a straddle the bottom surface 1k of the base 1 and the notched portions 20b and 20c, which are an outer peripheral side surface of the LD holder 20. The adhesive 21b is applied substantially symmetrically about the optical axis of the LD 19 and straddle the bottom surface 1k of the base 1 and the notched portions 20d and 20e, which are the outer peripheral side surface of the LD holder 20. As shown in FIG. 2, the LD holders III to VII are arranged such that the stepped portions 20g are oriented to the same direction; however, the LD holder I is arranged in a direction rotated 90° and the LD holder II is arranged in a direction rotated −90°. The light source module 24 has the configuration described above.

The substantially cylindrical LD holder 20 has the notched portions 20b and 20c as well as 20d and 20e that are symmetric about the center axis thereof, and the adhesives 21a and 21b are applied to the notched portions 20b to 20e. This configuration can suppress the increase in adhering margins, narrow a distance between the optical axes, and reduce the sizes of the entire device. Because the adhesive is applied to a plurality of locations that are substantially symmetric about the optical axis of the LD 19, even if the adhesive is cured and shrunk or linearly expanded, these phenomena cancel out each other, and a positional deviation is not generated in the LD holder 20. With this configuration, the yield of the light source device can be enhanced.

An operation of the present embodiment is described next. Diverging light 25a emitted from the LD 19 is converted into parallel light 25b by the collimator lens group formed of the first collimator lens 2 and the second collimator lens 4. Furthermore, the light 25b is concentrated on an end surface of the optical fiber 16 having a diameter of 400 micrometers by the condenser lens group formed of the first condenser lens 9 and the second condenser lens 11. Incidentally, precision of the parts and precision of assembling position have errors from design center values. A focal point 25c can be deviated from the end surface of the optical fiber 16 and a loss can be generated, and the amount of light entering the optical fiber 16 can be reduced in some cases. In this embodiment, when the LD 19 is moved in a direction intersecting with the optical axis at right angles, the optical axis of the parallel light 25b is inclined, and the focal point 25c can be moved in the direction intersecting with the optical axis at right angles. Therefore, a positional deviation of the light emitting point 19d of the LD 19, positional deviations of the optical axes of the first collimator lenses 2a to 2g and the second collimator lenses 4a to 4g, inclinations of the first condenser lens 9 and the second condenser lens 11, and a positional deviation of the receptacle 14 can be absorbed by adjusting the position of the LD 19 in the direction intersecting with the optical axis at right angles. Thus, the focal point 25c can be aligned with the end surface of the optical fiber 16.

An adjusting and fixing method according to the present embodiment is explained next with reference to FIGS. 7 to 10. A movable block 26 is driven in X, Y, and Z directions by an electric inching stage (not shown). Two pointed adjusting pins 27a and 27b capable of moving in the Z direction, and two UV fibers 28a and 28b for applying ultraviolet light (hereinafter, UV light) for curing the adhesive are fixed. The two adjusting pins 27a and 27b are elastically supported independent from each other to push the LD holder 20 against the bottom surface 1k of the base 1 (in a +Z direction in FIGS. 7 and 9). At this time, the pushing force of each of the adjusting pins 27a and 27b is set to about 0.05 Newton (5-gram weight) so that the LD holder 20 does not float from the bottom surface 1k of the base 1, but smoothly moves on the abutment surface. The UV fibers 28a and 28b are arranged such that a pair of the notched portions 20b and 20c of the LD holder 20 and the bottom surface 1k of the base 1 near the notched portions are irradiated with light at those spots. A socket (not shown) for supplying current is mounted on the LD 19 so that the LD 19 can emit light at a predetermined current.

The light source module 24 before the LD 19 and the LD holder 20 are fixed thereto is mounted on a fixing block 29 with no backlash. To facilitate understanding of the configuration, the fixing block 29 is shown with broken lines in FIGS. 7 and 9 and members located behind the fixing block 29 are shown through the fixing block 29. The optical fiber 16 is mounted on the receptacle 14, and a laser beam emitted from the end surface of the opposite end surface of the optical fiber 16 is received by an optical power meter 30.

Figure 7:
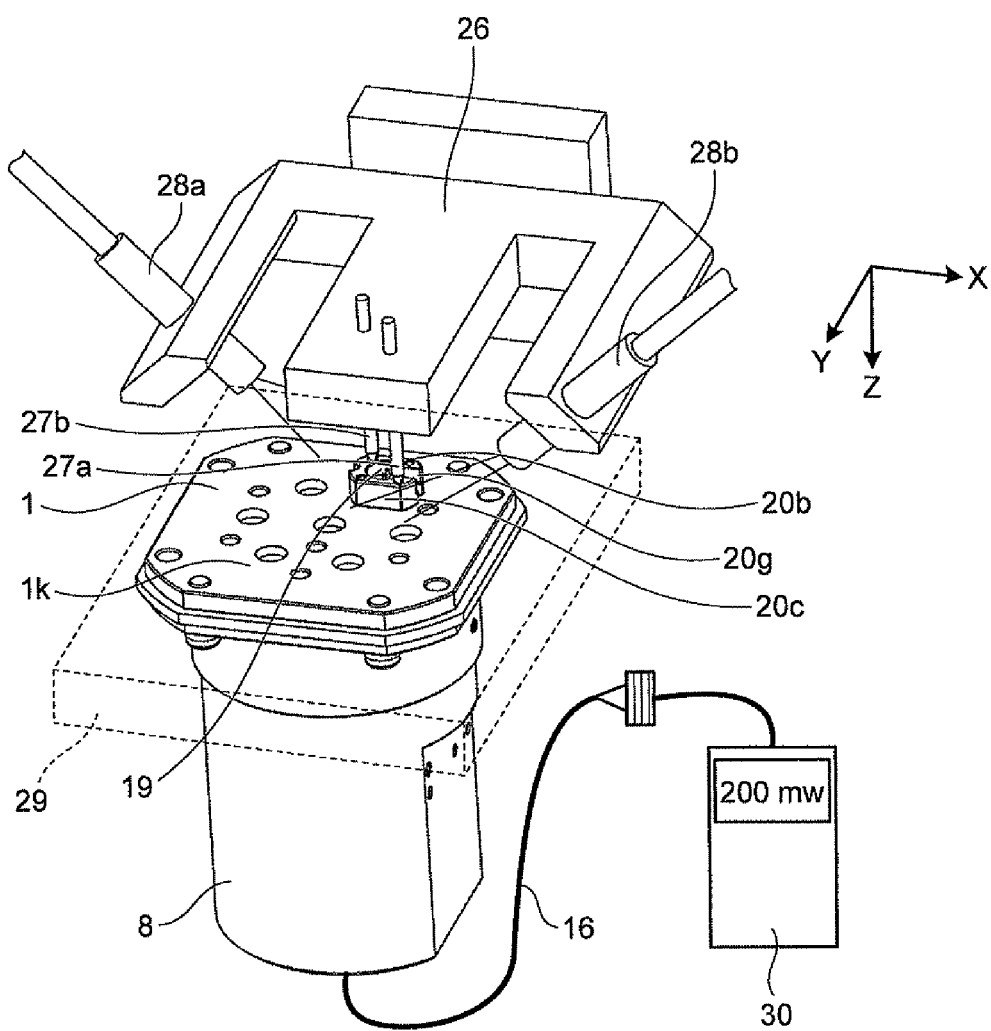
FIG. 7 depicts a perspective view explaining an adjusting and fixing method of an LD-I according to the first embodiment.
Figure 8:
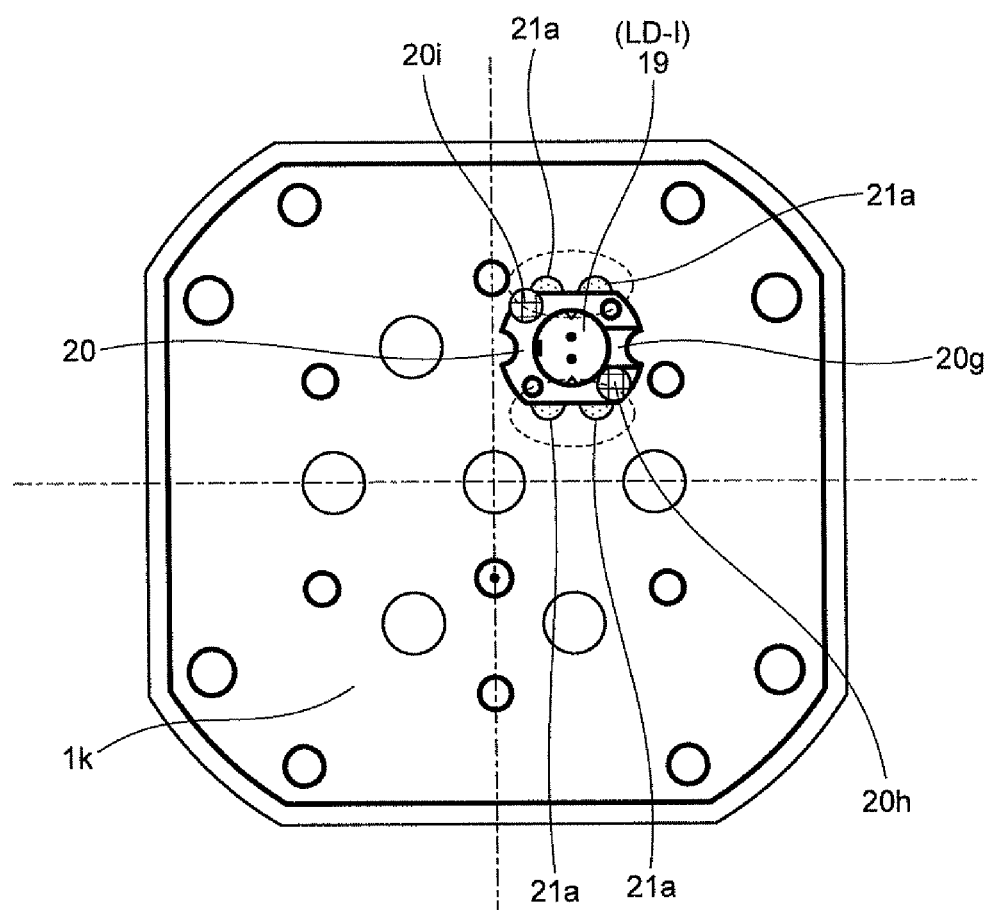
FIG. 8 depicts a bottom view explaining the adjusting and fixing method of the LD-I according to the first embodiment.

When the LID-I is to be adjusted and fixed, as shown in FIGS. 7 and 8, the LD holder 20 into which the LD 19 is press-fitted is set, and the adjusting pins 27a and 27b are inserted into a pair of the hole portions 20h and 20i. At this time, the stepped portion 20g of the LD holder 20 is set such that it is oriented rightward (the +X direction) in FIG. 8. In this state, current of a predetermined current value is made to flow through the LID-I, the movable block 26 is made to move in the X and Y directions such that laser power emitted from the optical fiber 16 becomes maximum, a user checks that the laser power becomes greater than a standard power that was previously obtained by calculation. The adhesive 21a is applied to the four locations about the optical axis of the LD 19 so as to straddle the bottom surface 1k of the base 1 and the notched portions 20b and 20c of the outer peripheral surface of the LD holder 20. Then, the adhesive 21a is irradiated with UV light from the UV fibers 28a and 28b and the adhesive 21a is cured. There is nothing that cuts off UV light emitted to the adhesive 21a, and the adhesive 21a can be reliably irradiated with UV light and cured. Because the adhesive 21a is applied to the locations symmetric about the ED holder 20, a deviation of the ED holder 20 is not easily generated when the adhesive is cured and shrunk or linearly expanded. Even if the LD holder 20 is inclined, because the positional deviation of the light emitting point 19d is not easily generated, a value of the optical power meter 30 is not varied at the time of adjustment. Thus, the adjusting operability is excellent. Also, because the position of the light emitting point 19d is not easily changed with respect to the inclination of the LD holder 20, a light source device having higher reliability can be provided.

Next, when the LD-II is to be adjusted and fixed, the LD holder 20, into which the LD 19 is press-fitted, is set on the left side of the LD-I that is adhered and fixed as shown in FIG. 8 such that the stepped portion 20g is oriented leftward (the −X direction). Thus, LD-II is adjusted and fixed in the same manner as the LD-I.

Figure 9:
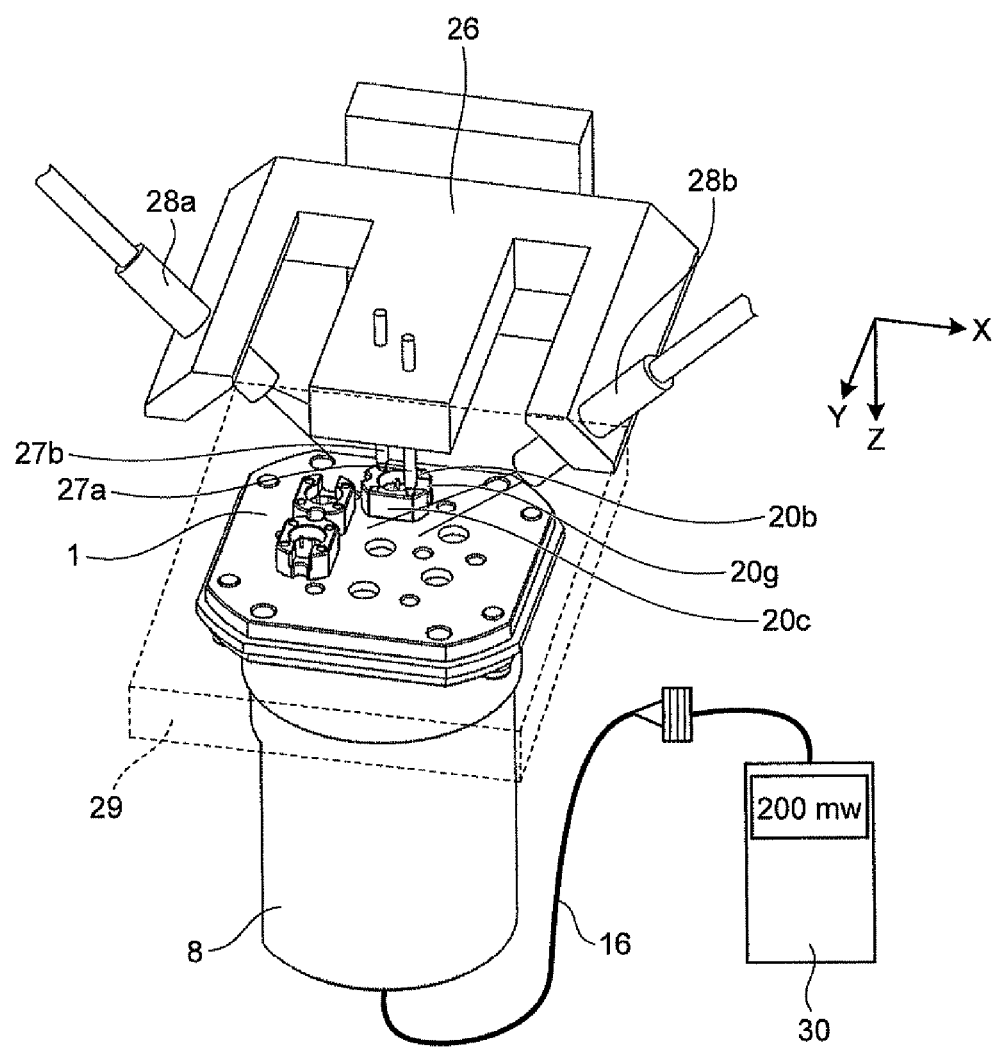
FIG. 9 depicts a perspective view explaining an adjusting and fixing method of an LD-III according to the first embodiment.
Figure 10:
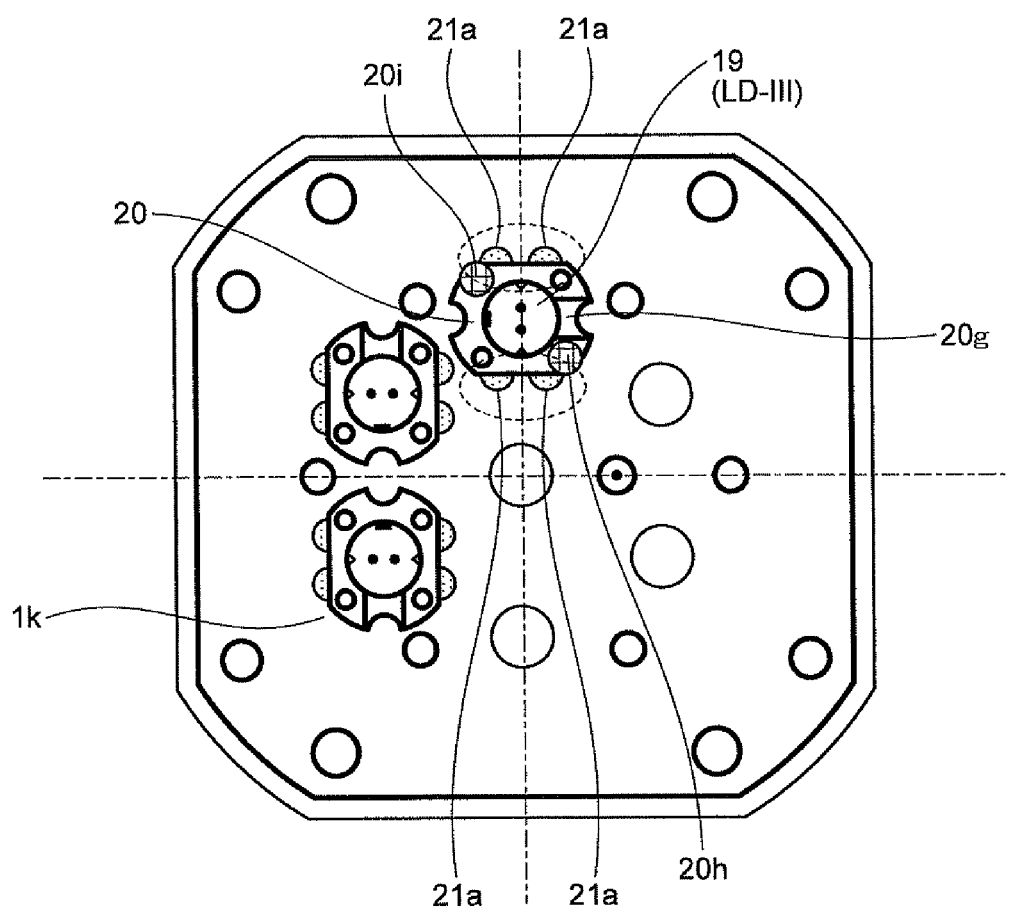
FIG. 10 depicts a bottom view explaining the adjusting and fixing method of the LD-III according to the first embodiment.

When the LD-III is to be fixed, as shown in FIGS. 9 and 10, the LD holder 20, into which the LD 19 is press-fitted, is set such that the stepped portion 20g is oriented rightward (the +X direction) in FIG. 10 in a state that the fixing block 29 is rotated 90° in a counterclockwise direction. Then, the adjusting pins 27a and 27b are inserted into a pair of the hole portions 20h and 20i, and the LD-III is adjusted and fixed in the same manner as the LD-I. The LD-IV to LD-VII are adjusted and fixed in the same manner. In the method described above, the fixing block 29 is rotated 90° in the counterclockwise direction when the LD-III to LD-VII are adjusted and fixed; however, they can be also adjusted and fixed by inserting the adjusting pins 27a and 27b into a pair of the hole portions 20j and 20k without rotating the fixing block.

Figure 11:
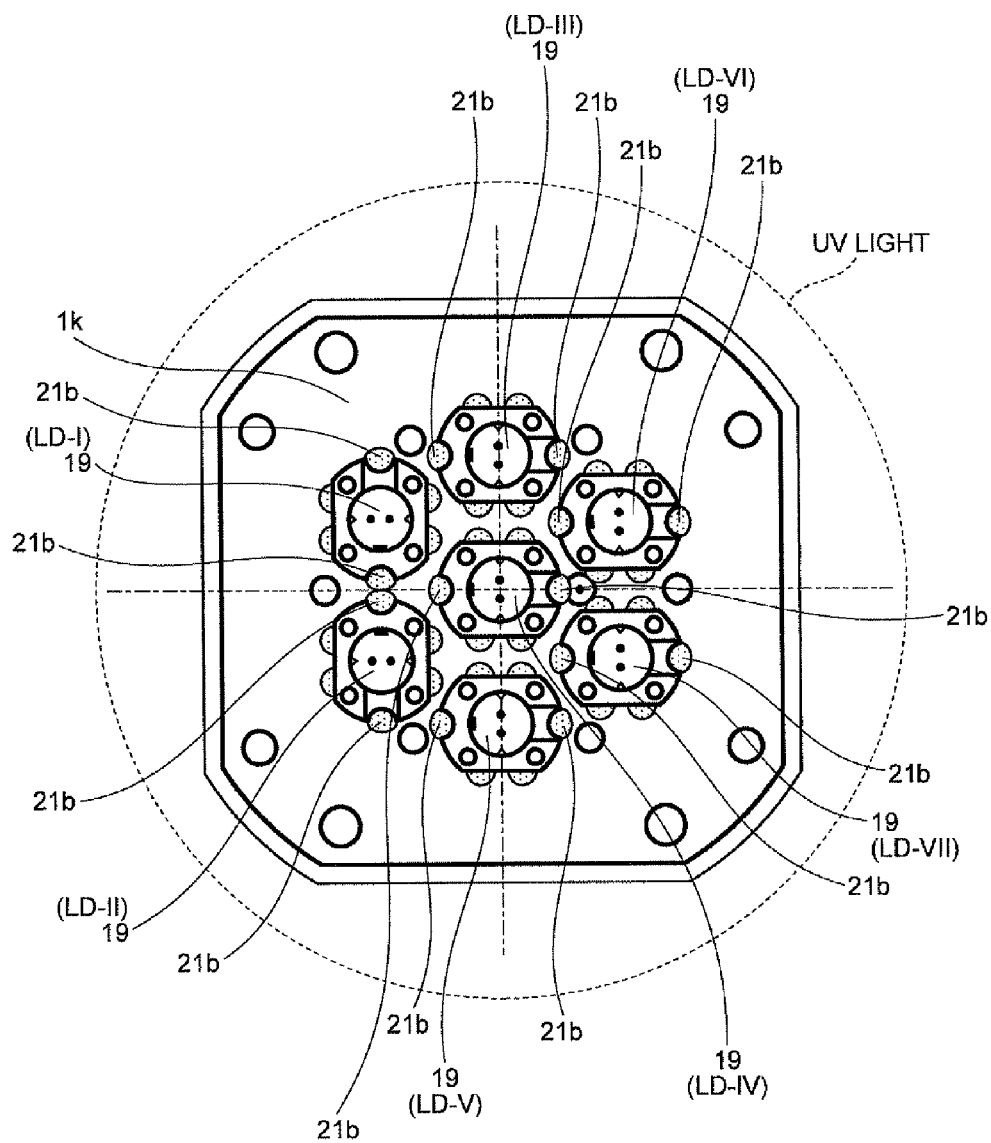
FIG. 11 depicts a bottom view explaining a method of additionally applying and curing an adhesive according to the first embodiment.

When the adjusting and fixing operations of the LD-I to LD-VII are completed, the light source module 24 is removed from an adjusting device. The adhesive 21b, which is the same kind as the adhesive 21a, is applied to two locations of each of the seven LD holders 20 so as to straddle the bottom surface 1k of the base 1 and the notched portions 20d and 20e that are outer peripheral surface of the LD holder 20 as shown in FIG. 11. The seven LD holders 20 are collectively irradiated with UV light and adhesive is cured. Because the adhesive 21b is additionally applied to the locations of the LD holder 20 symmetrically and is cured, the positional deviation of the LD holder 20 is not caused by curing and shrinking of the adhesive 21b and the adhering strength of the LD holder 20 can be enhanced. Because the adhesives 21a and 21b are arranged symmetrically on the LD holder 20, to which the LD 19 is fixed, near the abutment surface between the base 1 and the LD holder 20, they are fixed such that a deviation of the LD holder 20 caused by linear expansion of the adhesives 21a and 21b, the positional deviation of the optical axis of the LD 19, and inclination of the optical axis are not generated almost at all. The stepped portions 20g of the LD-III to LD-VII of the LD holders 20 are arranged such that they are oriented in the same direction as shown in FIG. 2; on the contrary, the LD-I is arranged in the orientation rotated 90° and the LD-II is arranged in the orientation rotated 90° in the opposite direction. With this, the polarizing direction of the LD 19 is not constant, a polarizing direction of a laser beam that enters the optical fiber 16 is mixed, and thus color unevenness of a picture when an image is displayed can be suppressed (uniformity can be improved). That is, the LDs 19 are press-fitted into the LD holders 20 such that the polarizing directions thereof are set the same, and the LD holders 20 are fixed to the base 1 such that orientations of some of the LD holders 20 are changed. Therefore, the polarizing directions of the LDs 19 are mixed, and the color unevenness of a picture can be suppressed.

Because the positions of the lens and the optical axis of the LD 19 are adjusted on the abutment surface between the base 1 to which the lens barrel 8 is fixed and the LD holder 20 to which the LD 19 is fixed, the adjusting operations can be performed at one location. Also, variation in part size and variation in optical characteristics can be absorbed, and the centering operation to the optimal position can be performed. That is, by relatively moving the LD holder 20, to which the LD 19 is fixed, within the abutment surface with respect to the base 1 to which the optics (the first collimator lens 2, the second collimator lens 4, the first condenser lens 9, and the second condenser lens 11) is fixed, the position of the optical axis of the LD 19 can be adjusted with one positioning operation. Because the abutment surface of the base 1 and the side surface of the LD holder 20 are adhered to each other, they can be reliably fixed to each other even if the LD holder 20 and the base 1 do not have UV-permeability, and durability is enhanced. The adjusting pins 27a and 27b of the adjusting device are pressed against the position-adjusting recesses (the hole portions 20h to 20k) provided in the lower surface 20f of the LD holder 20 and the position adjustment is performed. Therefore, the position adjustment in the order of micron can be easily performed, a shadow of an adjusting jig does not appear on the adhesive, and the adhesive can be reliably irradiated with UV.

Figure 12:
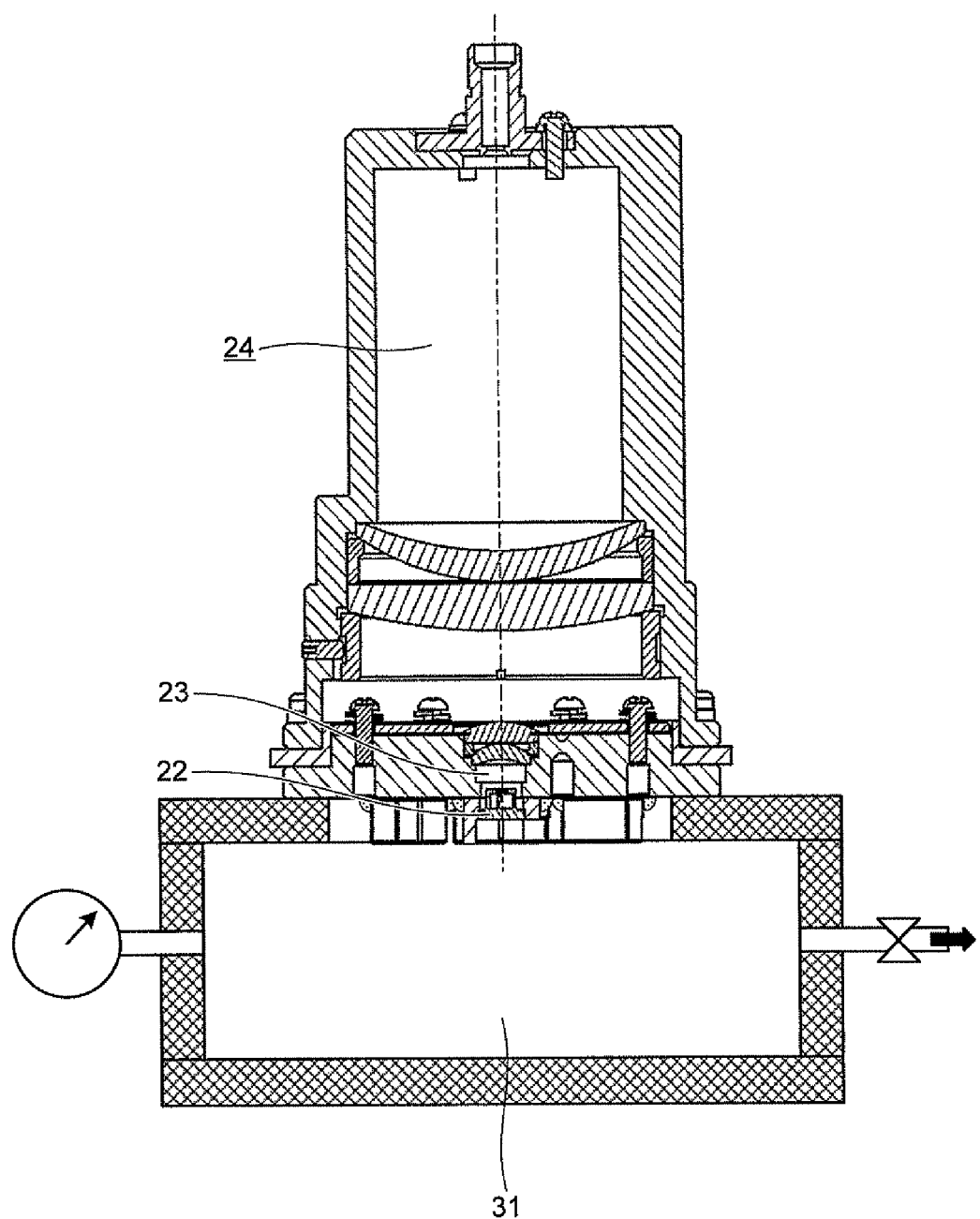
FIG. 12 depicts a schematic diagram explaining a method of sucking out gas according to the first embodiment.

The LD holder 20 is adhered and cured with high reliability such that the LD holder 20 is not deviated when it is adhered and after it was adhered. However, because the adhesives 21a and 21b generate acrylate-based monomer (monomer of acrylic ester) as out gas when they are cured, the out gas enters the small chamber 23 through a gap of several microns due to surface roughness formed on the abutment surface of between the base 1 and the LD holder 20, and the out gas exists in a form of gas. If the LD 19 lights up in this state, out gases are superposed on each other by photon energy, and the out gasses become fine particles and adhere to peripheries. This fouling causes a problem that it adheres also to surfaces of the laser-beam emitting window 19c of the LD 19 and the first collimator lens 2, at which photon energy density is particularly high. The permeability of the laser beam emitted from the LD 19 is lowered over time. To avoid this problem, in the present embodiment, as shown in FIG. 12, the base 1 on the side of the bottom surface 1k is intimately mounted on a decompressor 31, and out gases dispersed in the small chambers 23 at seven locations are collectively sucked and removed from the through hole 22. As described above, the out gas generated when the adhesive is cured is removed from an optical path, and contamination generated by interaction between the LD 19 and the photon energy is suppressed. Generally, an acrylic-based UV cure adhesive discharges gas even by heat. Therefore, out gas components are exhausted from the adhesives 21a and 21b by subjecting the light source module 24 to thermal processing. For example, if the acrylic-based UV cure adhesive is heated at 65° C. for 9 hours, remaining out gas amount can be reduced by 10% or less as compared with UV cure adhesive. At this time, because out gas generated from the adhesives 21a and 21b enters the small chamber 23 through a gap between the abutment surfaces of the base 1 and the LD holder 20. For this reason, the base 1 on the side of the bottom surface 1k is intimately mounted on the decompressor 31 after the thermal processing as shown in FIG. 12, so that out gases dispersed in the small chambers 23 at the seven locations are collectively sucked and eliminated via the through hole 22. The out gas is eliminated from the optical path in the manner described above, contamination generated by interaction between the LD 19 and the photon energy is further suppressed, and deterioration in permeability of the laser beam emitted from the LD 19 is prevented. The light source module 24 is adjusted and assembled as described above.

A UV cure adhesive is used as the adhesive 21 for fixing the LD holder 20 to the base 1, thermal processing is performed after the UV curing operation to generate out gas from the adhesive 21, out gas in the small chambers 23, each of which is formed by the stepped holes 1a to 1g of the base 1, the first collimator lens 2, the LD holder 20, and the LD 19, is sucked and exhausted from the through hole 22. Thus, it is possible to reliably remove the out gas and to prevent out gas from being generated with time.

Figure 13:
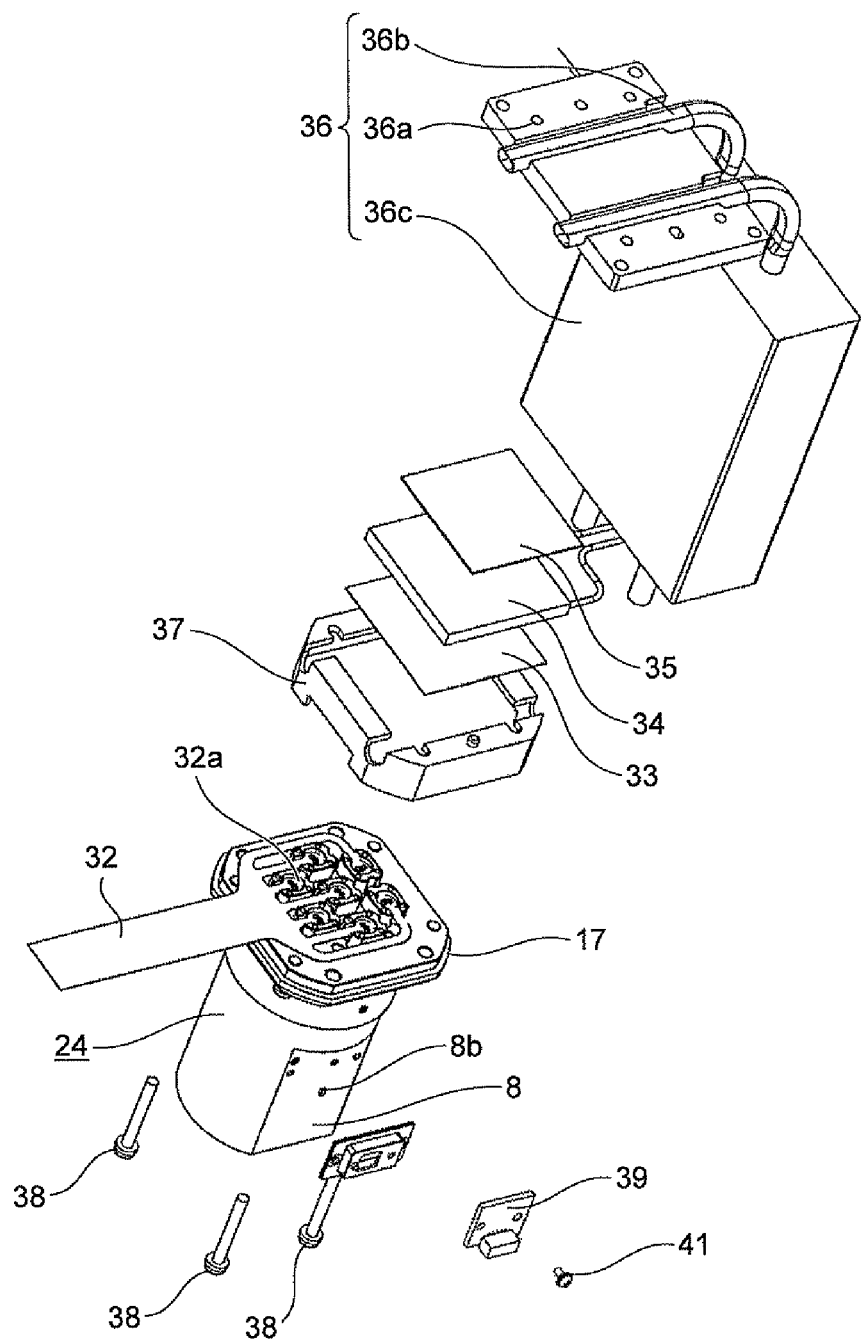
FIG. 13 depicts an exploded view of a configuration of the entire light source device according to the first embodiment.
Figure 14:
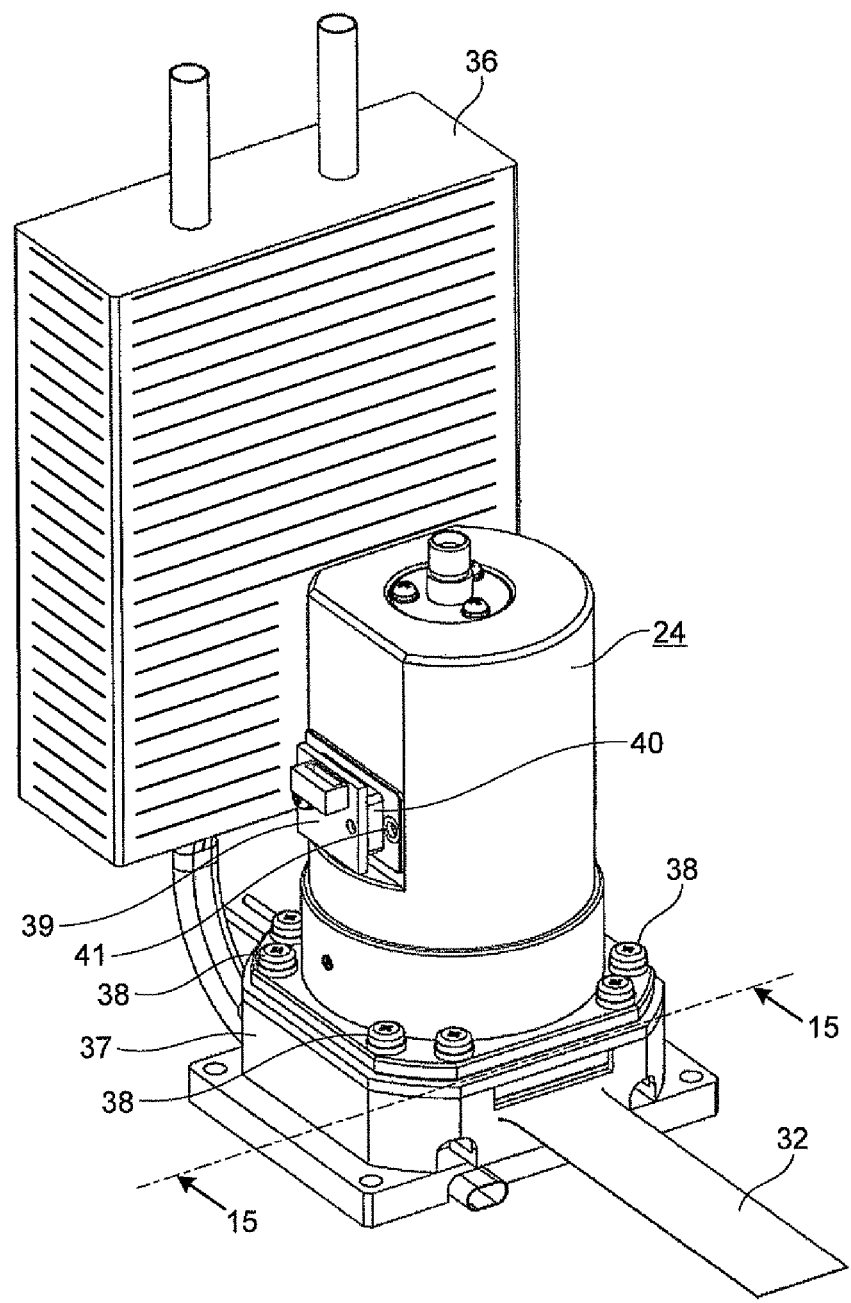
FIG. 14 depicts a perspective view of a configuration of the light source device according to the first embodiment in its entirety after assembling.
Figure 15:
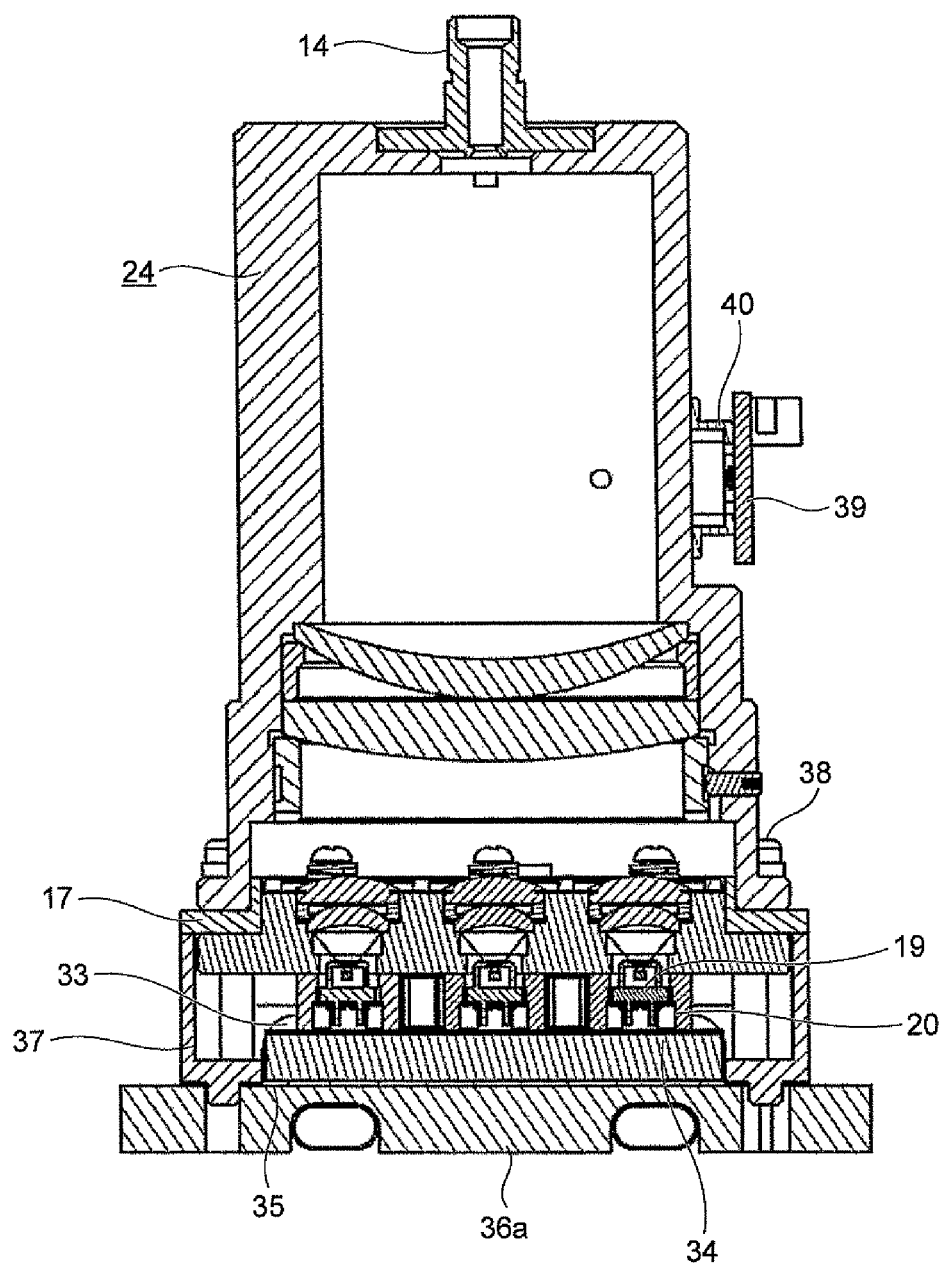
FIG. 15 depicts a sectional view of a configuration of the entire light source device according to the first embodiment.
Figure 16:
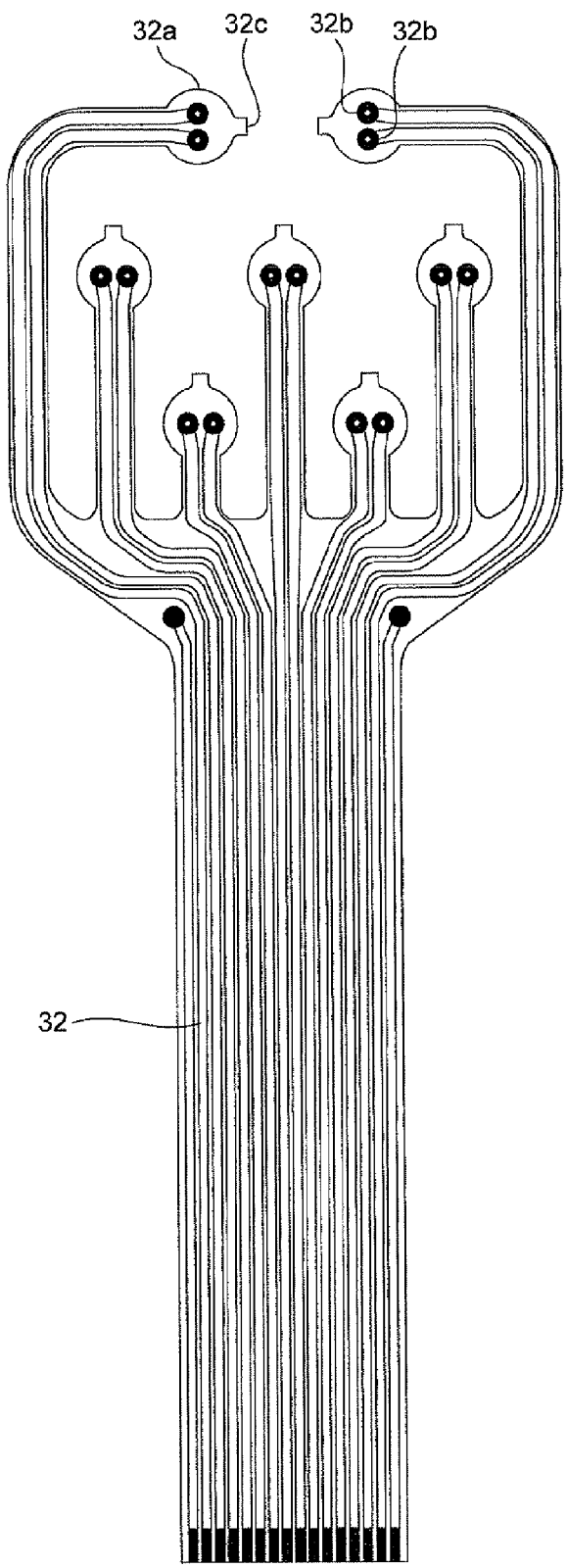
FIG. 16 depicts a configuration of a flexible printed board according to the first embodiment.
Figure 17:
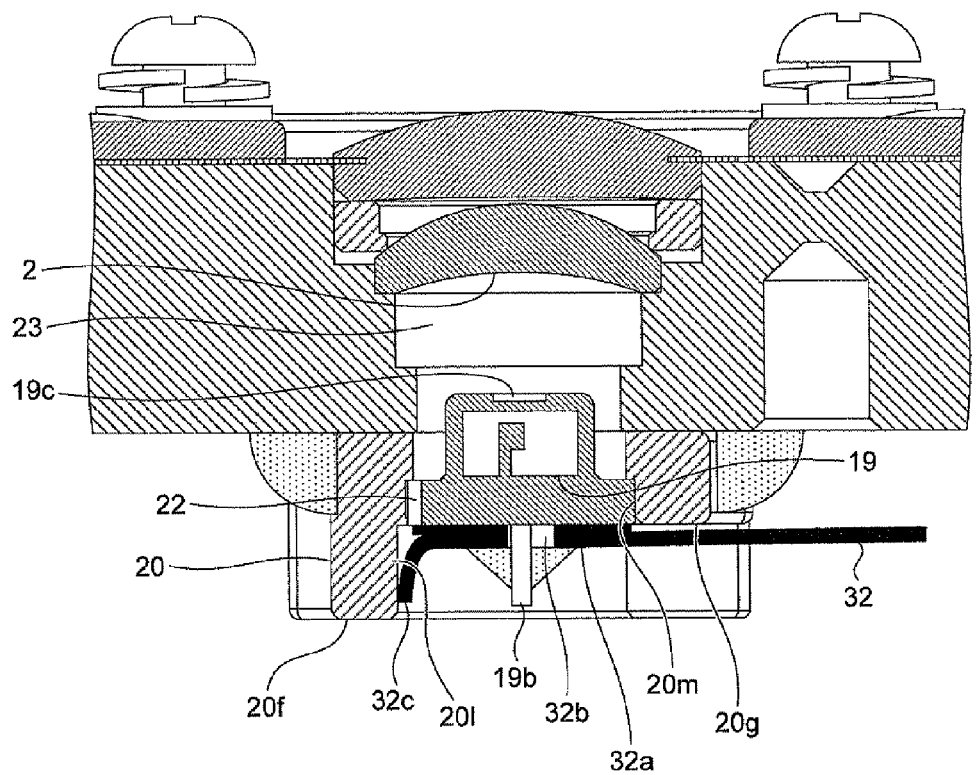
FIG. 17 depicts a sectional view explaining a soldering method of the flexible printed board according to the first embodiment.
Figure 18:
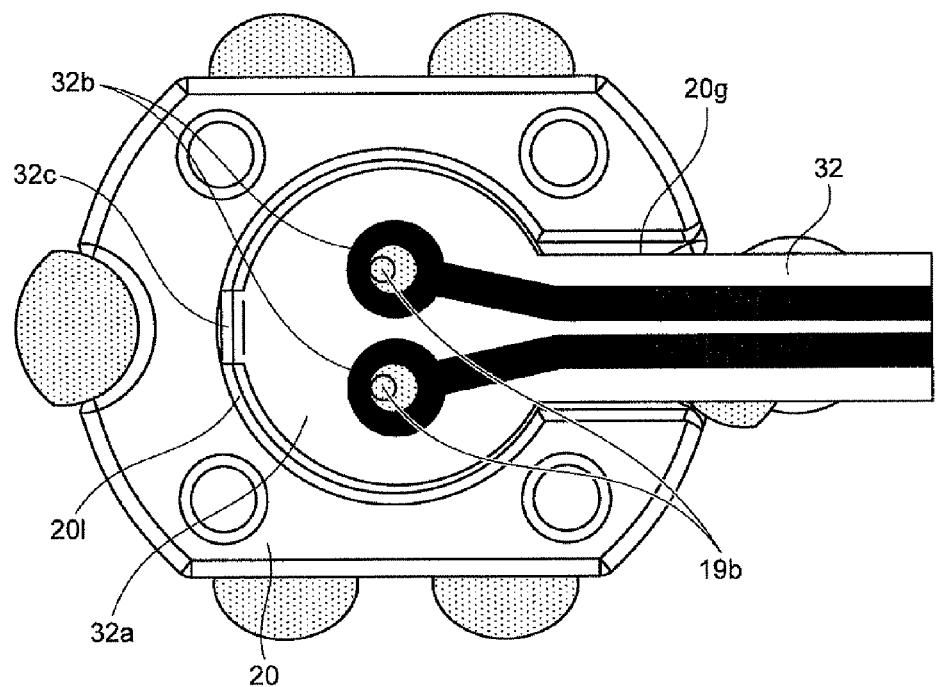
FIG. 18 depicts a bottom view explaining the soldering method of the flexible printed board according to the first embodiment.

FIGS. 13 to 15 depict a configuration of the light source device in its entirety, in which a flexible printed board (FPC) 32 as a feeding unit, a radiation unit 36 as a cooling unit, and an optical sensor are mounted on the light source module 24. FIG. 13 is an exploded view, FIG. 14 is a perspective view after assembling, and FIG. 15 is a sectional view taken along a line 15-15 in FIG. 14. The FPC 32 for supplying current to the LD 19 is made of polyimide, which has excellent light resistance and heat resistance. The FPC 32 passes through the stepped portion 20g of the LD holder 20 and is soldered to the conduction leads 19b that are an anode and a cathode of the LD 19. FIGS. 16 to 18 show details of the FPC 32. As shown in FIGS. 16 to 18, the FPC 32 includes substantially circular LD-mounting portions 32a on which the LD 19 is mounted. Each of the LD-mounting portions 32a includes a soldering land 32b having holes, and a projection 32c formed on a tip end of the LD-mounting portion 32a. Because the projection 32c comes into elastic contact with an inner surface hole 20l of the LD holder 20, the conduction leads 19b, and the holes of the soldering land 32b are pushed against one side (see FIGS. 17 and 18). The LD-mounting portion 32a is fixed such that it is not pulled from the LD holder 20 and does not rattle even before the LD-mounting portion 32a is soldered to the LD 19. With this configuration, because the LD-mounting portions 32a of the FPC 32 are stably fixed independently, the LDs 19 can be easily and reliably soldered even when there are a plurality of the LDs 19. Because the through hole 22 is closed with the projection 32c of the FPC 32, flux at the time of the soldering operation does not scatter, its fumes do not enter the small chamber 23 easily, and thus it is possible to prevent unwanted material from adhering to surfaces of the laser-beam emitting window 19c of the LD 19 and the first collimator lens 2. It is also possible to prevent scattered light emitted from the LD 19 from leaking out from the through hole 22. Therefore, it is possible to avoid a case that a material that can be a cause of contamination is generated from a part that is arranged therearound by leaked scattered light.

A thermal-conductive sheet 33 is made of a silicon-based elastic material having thickness of 0.5 millimeter. The Peltier module 34 includes a Peltier device, and a surface temperature thereof can be controlled by flowing a current through the Peltier device. The thermal-conductive sheet 35 has the same configuration as that of the thermal-conductive sheet 33. The radiation unit 36 includes a heat block 36a, a heat pipe 36b, and a fin 36c. A Peltier cover 37 is a molded article of polycarbonate having glass fibers like the spacer 17. The Peltier cover 37 is designed such that it can be positioned with respect to the base 1, the Peltier module 34 and the heat block 36a. Four fixing screws 38 are uniformly fastened to the heat block 36a through the Peltier cover 37 from the side of the base 1. With this configuration, the thermal-conductive sheet 33 and the thermal-conductive sheet 35 are elastically deformed, and the ID holder 20, the thermal-conductive sheet 33, the Peltier module 34, the thermal-conductive sheet 35, and the heat block 36a are intimately fixed. The Peltier cover 37 is positioned to a height where the Peltier cover 37 comes into contact with the spacer 17 and the heat block 36a that are fixed to the base 1 in a state that the fixing screws 38 are fastened, and the base 1 and the heat block 36a cannot approach each other more than this. Therefore, it is possible to avoid a case where an excessive force is applied to the Peltier module 34 due to excessive fastening of the fixing screws 38, or a vibration or an impact from outside, and the Peltier module 34 is damaged.

The heat block 36a is fixed to the base 1 by the conductive fixing screws 38 through the plastic Peltier cover 37. With this configuration, a thermal capacity of a portion thereof cooled by the Peltier module 34 is reduced, and the LD 19 can be efficiently cooled. That is, the energy required for cooling the LID 19 can be reduced. Also, the lifetime of the LD 19 can be increased.

An optical sensor is fixed to an optical sensor module 39. The optical sensor module 39 is fixed to the lens barrel 8 by a screw 41 through a sensor holder 40 so that a laser beam leaking from a hole 8b formed in a side surface of the lens barrel 8 can be detected. A position and a diameter of the hole 8b are designed such that the optical sensor is not saturated.

The operation of the light source device is described. First, to make the LD 19 emit light, a predetermined current flows through the FPC 32 in a state that the LDs 19 are connected to the control board in series. At this time, because the LD 19 generates heat, the LD 19 is cooled to a predetermined temperature by the Peltier module 34 through the LD holder 20 and the thermal-conductive sheet 33 based on temperature information of a thermistor (not shown) fixed to the base 1. Because the lens barrel 8 is thermally separated from the base 1 by the spacer 17, a thermal capacity in a range where the temperature is adjusted does not become large more than necessary, and it is possible to efficiently adjust the temperature. Heat generated on a surface opposite from the thermal-conductive sheet 33 when the Peltier module 34 is driven is transmitted to the heat block 36a through the thermal-conductive sheet 35, and transmitted to the fin 36c through the heat pipe 36b and is radiated in the air. The optical sensor module 39 can detect a laser beam that reflects on an inner surface of the lens barrel 8 when the LD 19 emits light and that leaks from the hole 8b. The optical sensor module 39 compares the laser beam with laser power emitted from the optical fiber 16, thereby monitoring whether there is abnormality such as bending or deterioration of the optical fiber 16. When abnormal condition is detected, the optical sensor module 39 is used for emergency stopping processing for interrupting the current that is supplied to the LD 19. The LD 19 is driven at necessary temperature and current, and is operated while monitoring that power is normally emitted from the optical fiber 16.

According to the light source device of the embodiment, the conduction lead 19b of the LD 19 and the FPC 32 are soldered to each other in the inner surface hole 20l of the LD holder 20, and the Peltier module 34 is intimately arranged on the lower surface 20f of the LD holder 20 through the thermal-conductive sheet 33. With this configuration, the FPC 32 can be connected using a small space, and LD 19 can be cooled efficiently and easily without sealing the LD 19 air-tightly.

The through hole that is in communication with outside air is provided in the LD holder 20 to which the LD 19 is fixed, the position of the LD holder is adjusted, and it is adhered and fixed. With this configuration, laser beams are synthesized, light is concentrated into the optical fiber, and the productivity and reliability are high although the device is inexpensive.

Second Embodiment

Figure 19:
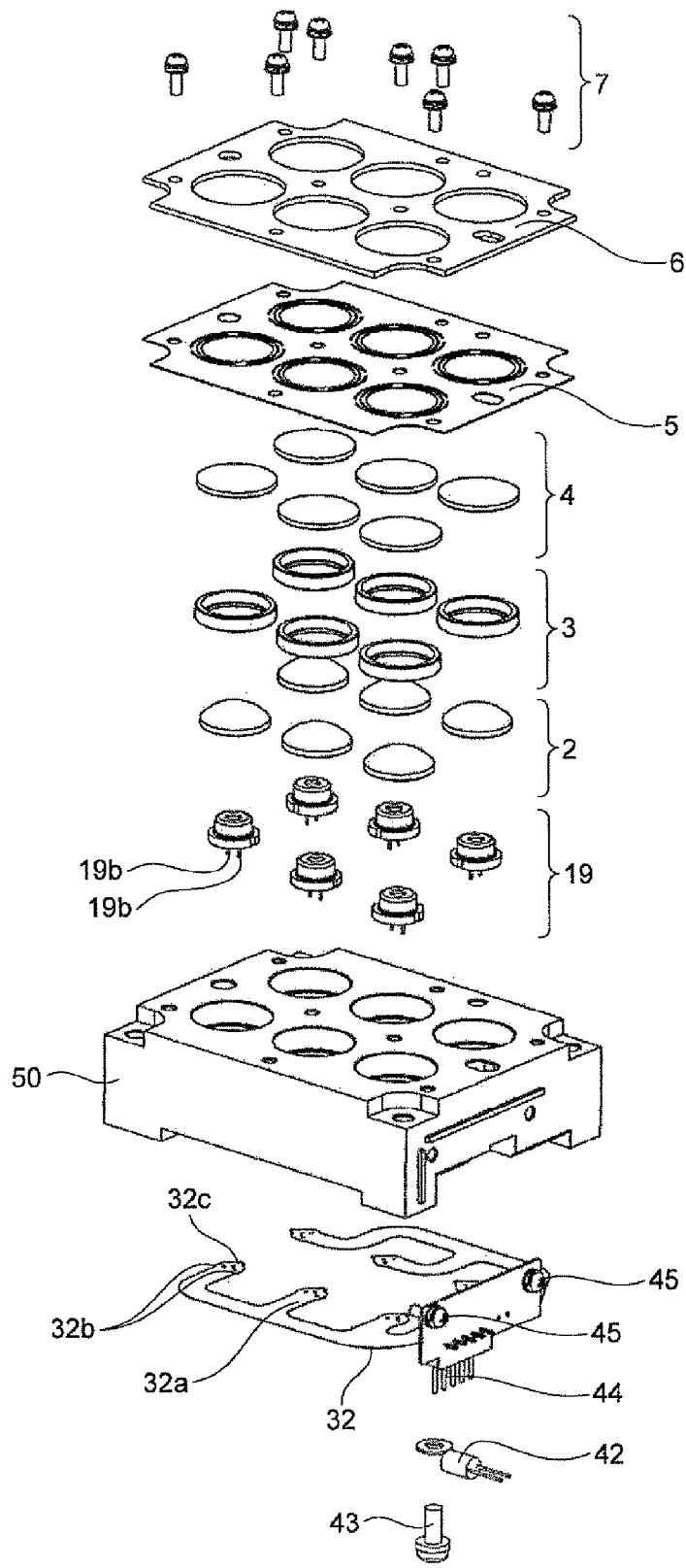
FIG. 19 depicts an exploded view of a configuration of relevant parts of a light source device according to a second embodiment the present invention.
Figure 20:
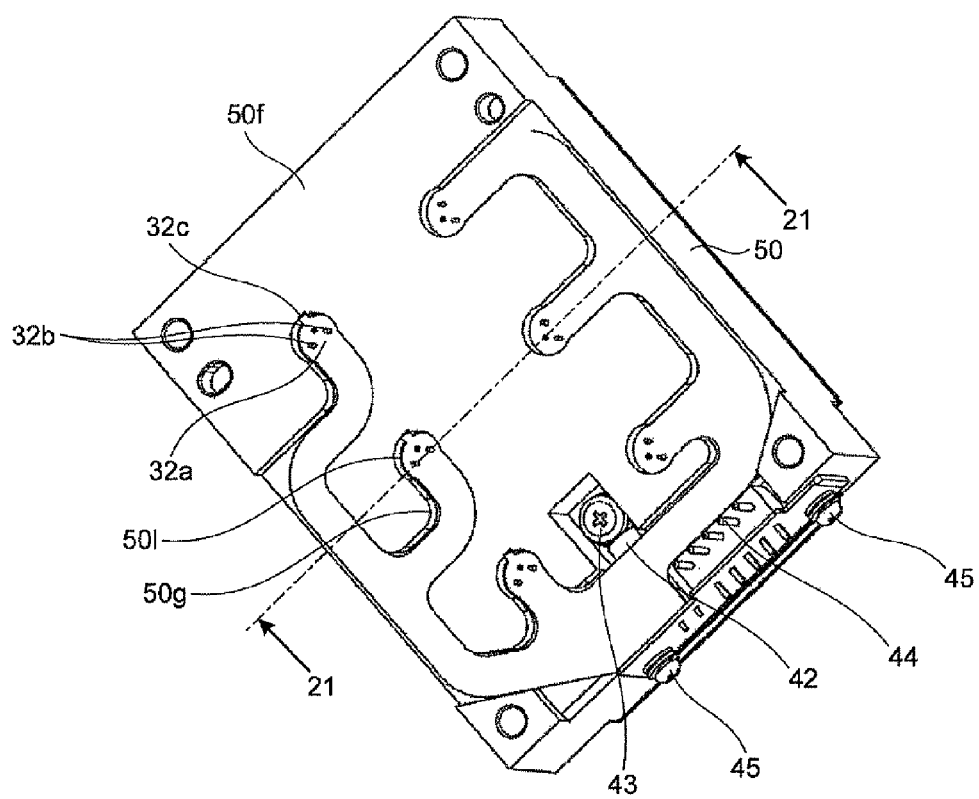
FIG. 20 depicts an assembly diagram of a configuration of relevant parts of the light source device according to the second embodiment.
Figure 21:
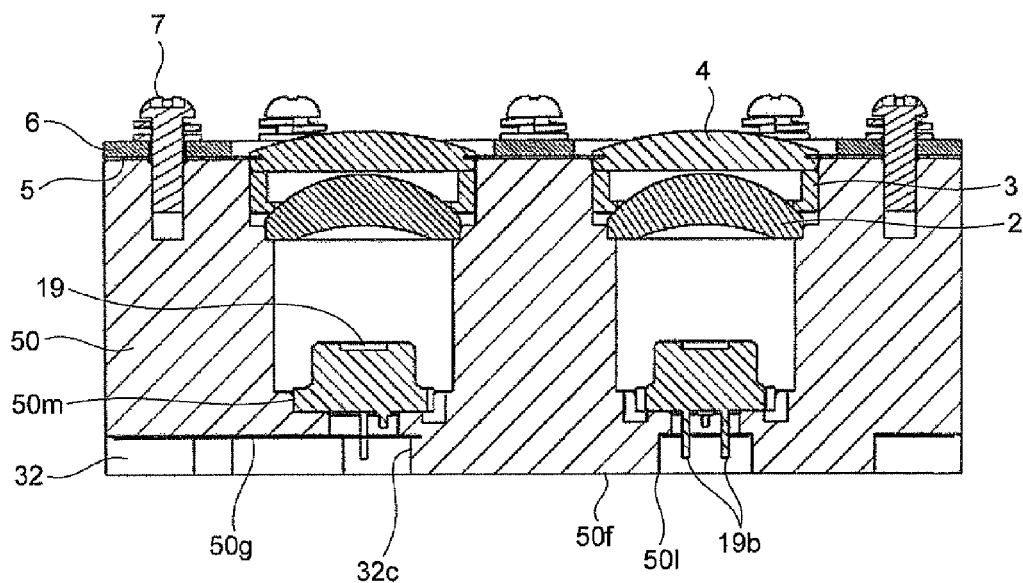
FIG. 21 depicts a sectional view of a configuration of relevant parts of the light source device according to the second embodiment.

FIGS. 19 to 21 depict a configuration of relevant parts of a light source device according to a second embodiment the present invention. FIG. 19 depicts an exploded view, FIG. 20 depicts an assembly diagram, and FIG. 21 depicts a sectional view taken along a line 21-21 in FIG. 20. Parts shown in the drawings are components corresponding to the base 1, the collimator lens group, the leaf spring 5, the restraining plate 6, the screws 7, the LDs 19, and the LD holders 20 according to the first embodiment. The members identical to those of the first embodiment are denoted by like reference numerals. In the second embodiment, six LDs 19 are press-fitted and fixed into press-fit holes 50m of single base holder 50 from the side of the conduction leads 19b. To suppress unevenness and ensure uniformity, the LDs 19 are arranged three each in a state in which rotating directions of optical axes of the LDs 19 are different from each other through 90° so that polarizing directions of the LDs 19 are not directed to the same orientation. Six first collimator lenses 2, six first spacers 3, and six second collimator lenses 4 are fitted into the base holder 50 corresponding to the six LDs 19. The collimator lens groups are precisely fixed to the base holder 50 such that the groups are not deviated even if a vibration or an impact is applied. This is made by fixing the one leaf spring 5 and the one restraining plate 6 to each other by the screws 7 without a deviation.

Figure 22:
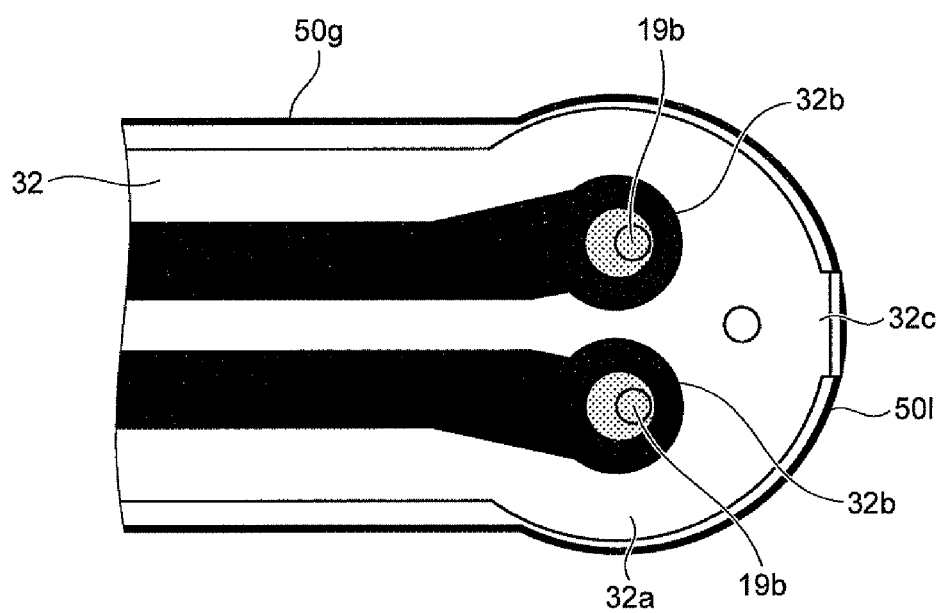
FIG. 22 depicts a bottom view of a soldering method of a flexible printed board according to the second embodiment.

Inner surface holes 50l which are arranged corresponding to the six LDs 19 so as to accommodate the conduction leads 19b, and a groove 50g in which the FPC 32 passes are formed in a back surface 50f of the base holder 50. The FPC 32 and tip ends of the conduction leads 19b are configured not to protrude from the back surface 50f of the base holder 50. As shown in FIG. 22, the substantially circular LD-mounting portion 32a of the FPC 32, which is attached to the LD 19, has the soldering lands 32b each having a hole and the projection 32c at a tip end thereof. As the projection 32c comes into elastic contact with the inner surface hole 50l of the base holder 50, the conduction leads 19b and the holes of the soldering lands 32b are pressed against one side. Then, the LD-mounting portion 32a is fixed such that it is not pulled out from the base holder 50 and it does not rattle even before the LD-mounting portion 32a is soldered to the LD 19. With this configuration, even when there are plural LDs 19 to be soldered, because the LD-mounting portions 32a of the FPC 32 are stably fixed, it is possible to achieve soldering of the LDs 19 with better operability and higher reliability. A thermistor 42 that measures a temperature of the base holder 50 is fixed to a recess formed in the back surface 50f of the base holder 50 by a screw 43 such that the thermistor 42 does not protrude from the back surface 50f. Furthermore, the thermistor 42 is soldered to the FPC 32. The LDs 19 and a connector 44 that connects the thermistor 42 and an external board with each other are soldered to an end of the FPC 32, and they are positioned and fixed to a side surface of the base holder 50 by screws 45.

Figure 23:
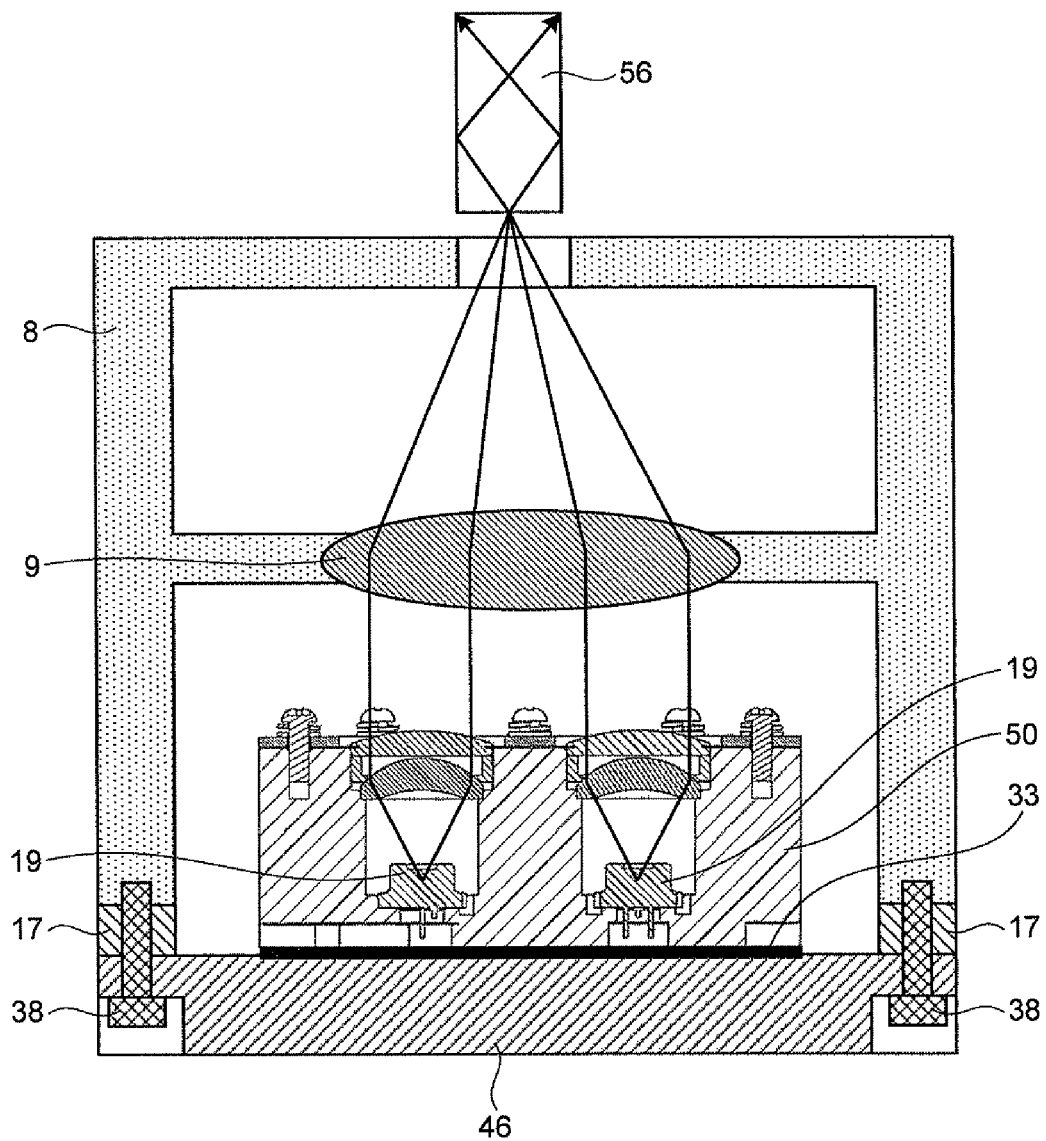
FIG. 23 depicts a sectional view of a configuration of the entire light source device according to the second embodiment.

FIG. 23 depicts a sectional view of the light source device after assembling a condenser lens and a cooling unit 46. The cooling unit 46 that can perform temperature adjustment by using a tiller or a Peltier module is closely arranged on the back surface 50f of the base holder 50 through a thermal-conductive sheet 33 by screws, thereby cooling the LDs 19. The lens barrel 8 to which the condenser lens 9 is fixed is fastened to the cooling unit 46 by conductive screws 38 through the spacer 17 that is a molded article made of polycarbonate having glass fibers. The spacer 17 has sufficiently lower thermal conductivity than those of the cooling unit 46 and the lens barrel 8. With this configuration, heat is easily transferred from the base holder 50 to the cooling unit 46; however, heat is not easily transferred from the lens barrel 8 (in other words, a thermal capacity of a portion that is cooled by the cooling unit 46 is small), and thus the LDs 19 can be efficiently cooled. That is, the energy required for cooling the LDs 19 can be reduced, and the lifetime of the LD 19 can be increased.

The ground of the LD 19 is electrically connected to the lens barrel 8 through the base holder 50 and the fixing screws 38 by fixing the metal lens barrel 8 to the cooling unit 46 by the conductive fixing screws 38 through the plastic spacer 17. Thus, it is possible to suppress generation of parasitic emissions when the LD 19 is pulse-driven at high frequencies. Similarly to the first embodiment, the lens barrel 8 can be fixed to the base holder 50 through the plastic spacer 17 using a conductive screw.

Because the FPC 32 and the conduction leads 19b of the LD 19 are soldered to each other in the inner surface hole 50l of the base holder 50, the FPC 32 can be connected with a small space. Also, because the cooling unit 46 is closely arranged on the back surface 50f of the base holder 50, the LD 19 can be efficiently cooled easily without air-tightly sealing it.

In the first embodiment, laser beams are concentrated on the end of the optical fiber having the diameter of 400 micrometers. Thus, positions of the optical axis of the LD and the optical axis of the collimator lens are adjusted. Meanwhile, as in the second embodiment, when beams are concentrated on a rod 56 having an end of a large area, it is possible to assemble the LD and the collimator lens with mechanical precision. That is, the optical axes adjustment is not necessarily required. Even with this configuration, it is possible to realize a light source device that can efficiently cool the semiconductor laser with excellent assembling operability.

According to the present invention, it is possible to increase the lifetime of a light source device while suppressing deterioration in light emitting efficiency of a semiconductor laser device due to heat.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A light source device having a plurality of laser modules, in each of which a semiconductor laser is arranged on one side of a stem and electricity-receiving terminals, which receive electricity for driving the semiconductor laser, are arranged on the other side of the stem, and configured to concentrate laser beams emitted from the laser modules and emit the concentrated laser beams, the light source device comprising:
   a module fixing body having a plurality of mounting holes into which the laser modules are fitted and accommodated, respectively;
   an electricity-supplying member is connected to the electricity-receiving terminals of the laser module accommodated in the mounting hole; and
   a cooling member that cools each of the laser modules, wherein
   a groove in which the electricity-supplying member is accommodated is formed in a back surface of the module fixing body, and
   the cooling member is closely arranged on the back surface of the module fixing body where the groove is formed, and wherein the electricity-supplying member is a flexible printed board, branched off in the groove and electricity-supplying terminals are formed at respective ends of branched-off flexible printed boards so that the electricity-supplying terminals are connected with respective electricity-receiving terminals.

2. The light source device according to claim 1, wherein
a projection is formed on the end of the electricity-supplying member, and
the end of the electricity-supplying member is fixed to the mounting hole while deforming the projection by an inner peripheral surface of the mounting holes.

3. The light source device according to claim 1, wherein the cooling member comprises:
a Peltier module being abutted against the module fixing body on a heat-absorbing side, and
a heat block arranged on a heat-generating side of the Peltier module.

4. The light source device according to claim 2, wherein the cooling member comprises:
a Peltier module being abutted against the module fixing body on a heat-absorbing side, and
a heat block arranged on a heat-generating side of the Peltier module.

5. The light source device according to claim 1, wherein the module fixing body further comprises:
a plurality of cylindrical holders having the mounting holes, and
a plate-like base having a plurality of through holes through which laser beams from the laser modules fixed to the holders pass, the holders being fixed to the base such that the through holes and the mounting holes are connected to each other.

6. The light source device according to claim 2, wherein the module fixing body further comprises:
a plurality of cylindrical holders having the mounting holes, and
a plate-like base having a plurality of through holes through which laser beams from the laser modules fixed to the holders pass, the holders being fixed to the base such that the through holes and the mounting holes are connected to each other.

7. The light source device according to claim 3, wherein the module fixing body further comprises:
a plurality of cylindrical holders having the mounting holes, and
a plate-like base having a plurality of through holes through which laser beams from the laser modules fixed to the holders pass, the holders being fixed to the base such that the through holes and the mounting holes are connected to each other.

8. The light source device according to claim 4, wherein the module fixing body further comprises:
a plurality of cylindrical holders having the mounting holes, and
a plate-like base having a plurality of through holes through which laser beams from the laser modules fixed to the holders pass, the holders being fixed to the base such that the through holes and the mounting holes are connected to each other.

9. The light source device according to claim 5, further comprising:
a cylindrical lens holding body that is fixed to the base and holding a condenser lens that collectively concentrates the laser beams emitted from the through holes, and
a spacer that is interposed between the base and the lens holding body and having thermal conductivity lower than that of the lens holding body.

10. The light source device according to claim 6, further comprising:
a cylindrical lens holding body that is fixed to the base and holding a condenser lens that collectively concentrates the laser beams emitted from the through holes, and
a spacer that is interposed between the base and the lens holding body and having thermal conductivity lower than that of the lens holding body.

11. The light source device according to claim 7, further comprising:
a cylindrical lens holding body that is fixed to the base and holding a condenser lens that collectively concentrates the laser beams emitted from the through holes, and
a spacer that is interposed between the base and the lens holding body and having thermal conductivity lower than that of the lens holding body.

12. The light source device according to claim 8, further comprising:
a cylindrical lens holding body that is fixed to the base and holding a condenser lens that collectively concentrates the laser beams emitted from the through holes, and
a spacer that is interposed between the base and the lens holding body and having thermal conductivity lower than that of the lens holding body.

13. The light source device according to claim 5, further comprising:
a cylindrical lens holding body that is fixed to the cooling member and holding a condenser lens that collectively concentrates the laser beams emitted from the through holes, and
a spacer that is interposed between the cooling member and the lens holding body and having thermal conductivity lower than that of the lens holding body.

14. The light source device according to claim 6, further comprising:
a cylindrical lens holding body that is fixed to the cooling member and holding a condenser lens that collectively concentrates the laser beams emitted from the through holes, and
a spacer that is interposed between the cooling member and the lens holding body and having thermal conductivity lower than that of the lens holding body.

15. The light source device according to claim 7, further comprising:
   a cylindrical lens holding body that is fixed to the cooling member and holding a condenser lens that collectively concentrates the laser beams emitted from the through holes, and
   a spacer that is interposed between the cooling member and the lens holding body and having thermal conductivity lower than that of the lens holding body.

16. The light source device according to claim 8, further comprising:
   a cylindrical lens holding body that is fixed to the cooling member and holding a condenser lens that collectively concentrates the laser beams emitted from the through holes, and
   a spacer that is interposed between the cooling member and the lens holding body and having thermal conductivity lower than that of the lens holding body.

17. The light source device according to claim 1, wherein the module fixing body is integrally formed.

18. The light source device according to claim 17, further comprising:
   a cylindrical lens holding body that is fixed to the cooling member and holding a condenser lens that collectively concentrates the laser beams emitted from the mounting holes, and
   a spacer that is interposed between the cooling member and the lens holding body and having thermal conductivity lower than that of the lens holding body.

19. The light source device according to claim 17, further comprising:
   a cylindrical lens holding body that is fixed to the module fixing body and holding a condenser lens that collectively concentrates the laser beams emitted from the mounting holes, and
   a spacer that is interposed between the module fixing body and the lens holding body and having thermal conductivity lower than that of the lens holding body.

20. The light source device according to claim 3, further comprising a Peltier cover positioned with respect to the module fixing body, the Peltier module, and the heat block in a manner such that the heat block is fixed to the module fixing body through the Peltier cover.

21. The light source device according to claim 4, further comprising a Peltier cover positioned with respect to the module fixing body, the Peltier module, and the heat block in a manner such that the heat block is fixed to the module fixing body through the Peltier cover.

22. The light source device according to claim 20, wherein the cooling member further comprising: a heat pipe and a fin, wherein heat generated on a surface opposite from a first thermal-conductive sheet interposed between the Peltier module and the plurality of cylindrical holders is transmitted to the heat block through a second thermal-conductive sheet interposed between the Peltier module and the heat block, and wherein heat generated on the surface opposite from the first thermal-conductive sheet is transmitted to the fin through the heat pipe.

23. The light source device according to claim 21, wherein the cooling member further comprising: a heat pipe and a fin, wherein heat generated on a surface opposite from a first thermal-conductive sheet interposed between the Peltier module and the plurality of cylindrical holders is transmitted to the heat block through a second thermal-conductive sheet interposed between the Peltier module and the heat block, and wherein heat generated on the surface opposite from the first thermal-conductive sheet is transmitted to the fin through the heat pipe.

* * * * *